US012690442B2

(12) United States Patent
Majhi et al.

(10) Patent No.: US 12,690,442 B2
(45) Date of Patent: Jul. 21, 2026

(54) REPLACEMENT VIA AND BURIED OR BACKSIDE POWER RAIL

(71) Applicant: Intel Corporation, Santa Clara, CA (US)

(72) Inventors: Prashant Majhi, San Jose, CA (US); Klaus Max Schruefer, Baldham (DE); Anand Murthy, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 362 days.

(21) Appl. No.: 17/556,414

(22) Filed: Dec. 20, 2021

(65) Prior Publication Data

US 2023/0197613 A1     Jun. 22, 2023

(51) Int. Cl.
*H10W 20/41*          (2026.01)
*H10D 30/67*          (2025.01)
(Continued)

(52) U.S. Cl.
CPC ...... *H10W 20/427* (2026.01); *H10D 30/6735* (2025.01); *H10D 30/6757* (2025.01);
(Continued)

(58) Field of Classification Search
CPC ........... H01L 23/5286; H01L 21/76877; H01L 23/53238; H01L 23/53266; H01L 21/76849; H01L 21/76883; H01L 21/76897; H01L 21/743; H01L 21/76895; H01L 23/535; H01L 23/482; H10D 30/6735; H10D 30/6757; H10D 62/118;

H10D 62/364; H10D 84/0149; H10D 84/038; H10D 84/83; H10D 30/014; H10D 30/43; H10D 62/121; H10D 64/251;
(Continued)

(56) References Cited

U.S. PATENT DOCUMENTS

2004/0198055 A1    10/2004  Wang
2012/0326313 A1    12/2012  Uzoh et al.
(Continued)

OTHER PUBLICATIONS

Extended European Search Report received for EP Application No. 22201694.1 dated Apr. 19, 2023. 9 pages.
(Continued)

*Primary Examiner* — Thanh T Nguyen
(74) *Attorney, Agent, or Firm* — Arcane Law PLLC

(57) ABSTRACT

An integrated circuit structure includes a first sub-fin, a second sub-fin laterally spaced from the first sub-fin, a first transistor device over the first sub-fin and having a first contact, a second transistor device over the second sub-fin and having a second contact, and a continuous and monolithic body of conductive material extending vertically between the first and second transistor devices and the first and second sub-fins. The body of conductive material has (i) an upper portion between the first and second transistor devices and (ii) a lower portion between the first and second sub-fins. A continuous conformal layer extends along a sidewall of the lower portion of the body and a sidewall of the upper portion of the body. The integrated circuit structure further comprises a conductive interconnect feature connecting the upper portion of the body to at least one of the first and second contacts.

20 Claims, 19 Drawing Sheets

(51) Int. Cl.
   *H10D 62/10*          (2025.01)
   *H10W 20/00*          (2026.01)
(52) U.S. Cl.
   CPC ........ *H10D 62/118* (2025.01); *H10W 20/056*
                     (2026.01); *H10W 20/425* (2026.01)
(58) Field of Classification Search
   CPC .. B82Y 10/00; H10W 20/427; H10W 20/056;
                                           H10W 20/425
   See application file for complete search history.

(56)                   References Cited

U.S. PATENT DOCUMENTS

| | | |
|---|---|---|
| 2015/0262912 A1 | 9/2015 | Ting |
| 2018/0294225 A1 | 10/2018 | Lee et al. |
| 2019/0181020 A1 | 6/2019 | Jeon et al. |
| 2020/0135634 A1* | 4/2020 | Chiang ............... H10D 64/251 |
| 2020/0219813 A1* | 7/2020 | Paul .................... H10D 64/251 |
| 2020/0294998 A1 | 9/2020 | Lilak et al. |
| 2021/0296156 A1* | 9/2021 | Leobandung ........ H10D 62/116 |
| 2023/0163024 A1 | 5/2023 | Majhi et al. |

OTHER PUBLICATIONS

Extended European Search Report received for EP Application No.
22213221.9, dated Mar. 9, 2023. 7 pages.

* cited by examiner

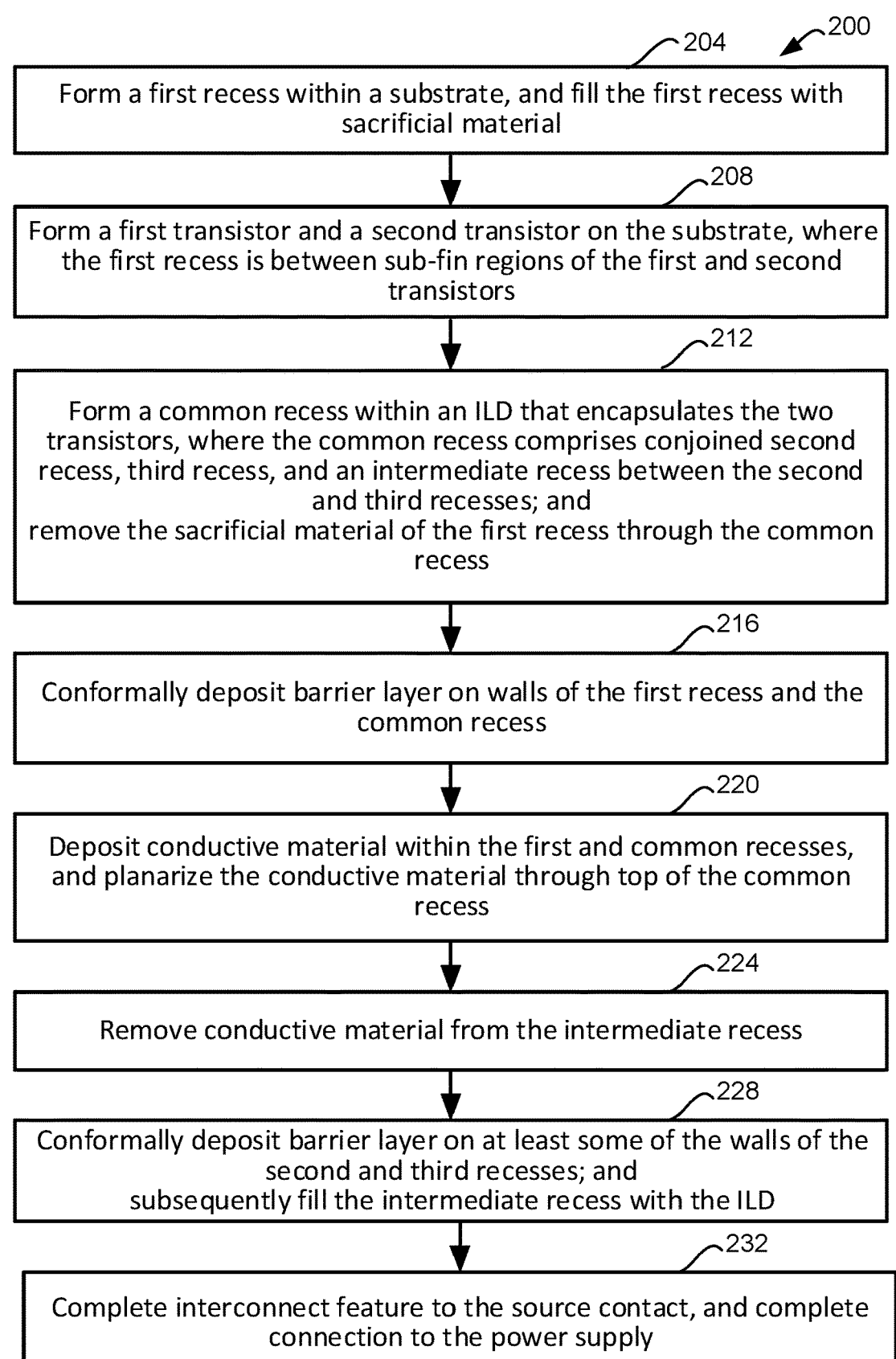

204

200

Form a first recess within a substrate, and fill the first recess with sacrificial material

208

Form a first transistor and a second transistor on the substrate, where the first recess is between sub-fin regions of the first and second transistors

212

Form a common recess within an ILD that encapsulates the two transistors, where the common recess comprises conjoined second recess, third recess, and an intermediate recess between the second and third recesses; and
remove the sacrificial material of the first recess through the common recess

216

Conformally deposit barrier layer on walls of the first recess and the common recess

220

Deposit conductive material within the first and common recesses, and planarize the conductive material through top of the common recess

224

Remove conductive material from the intermediate recess

228

Conformally deposit barrier layer on at least some of the walls of the second and third recesses; and
subsequently fill the intermediate recess with the ILD

232

Complete interconnect feature to the source contact, and complete connection to the power supply

FIG. 2

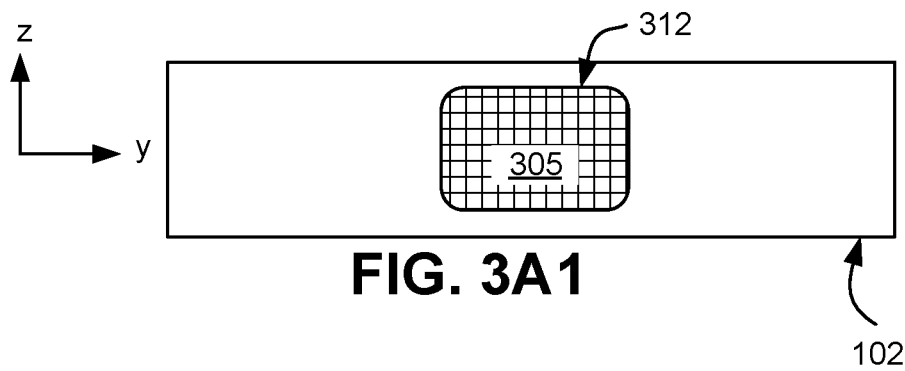
FIG. 3A1
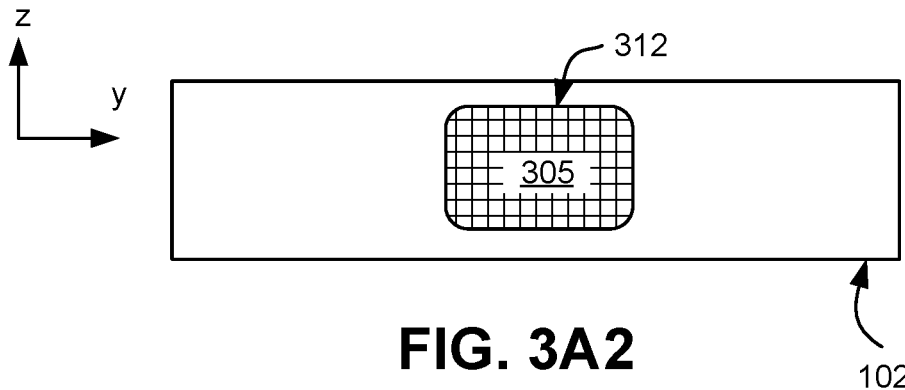
FIG. 3A2
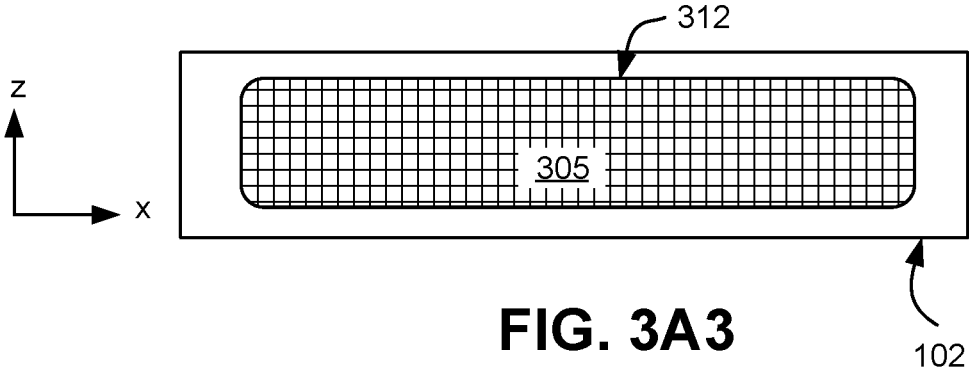
FIG. 3A3

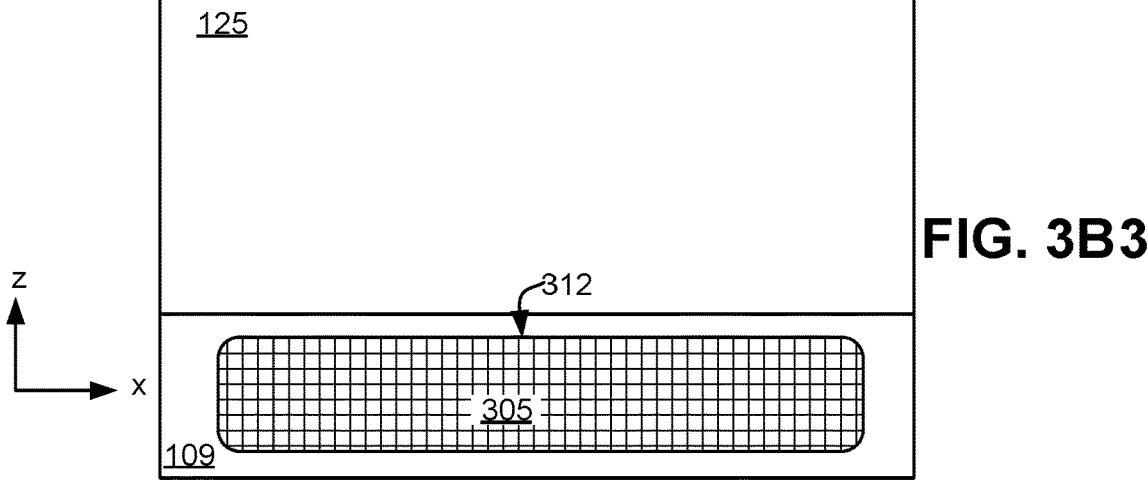
FIG. 3B1
FIG. 3B2
FIG. 3B3

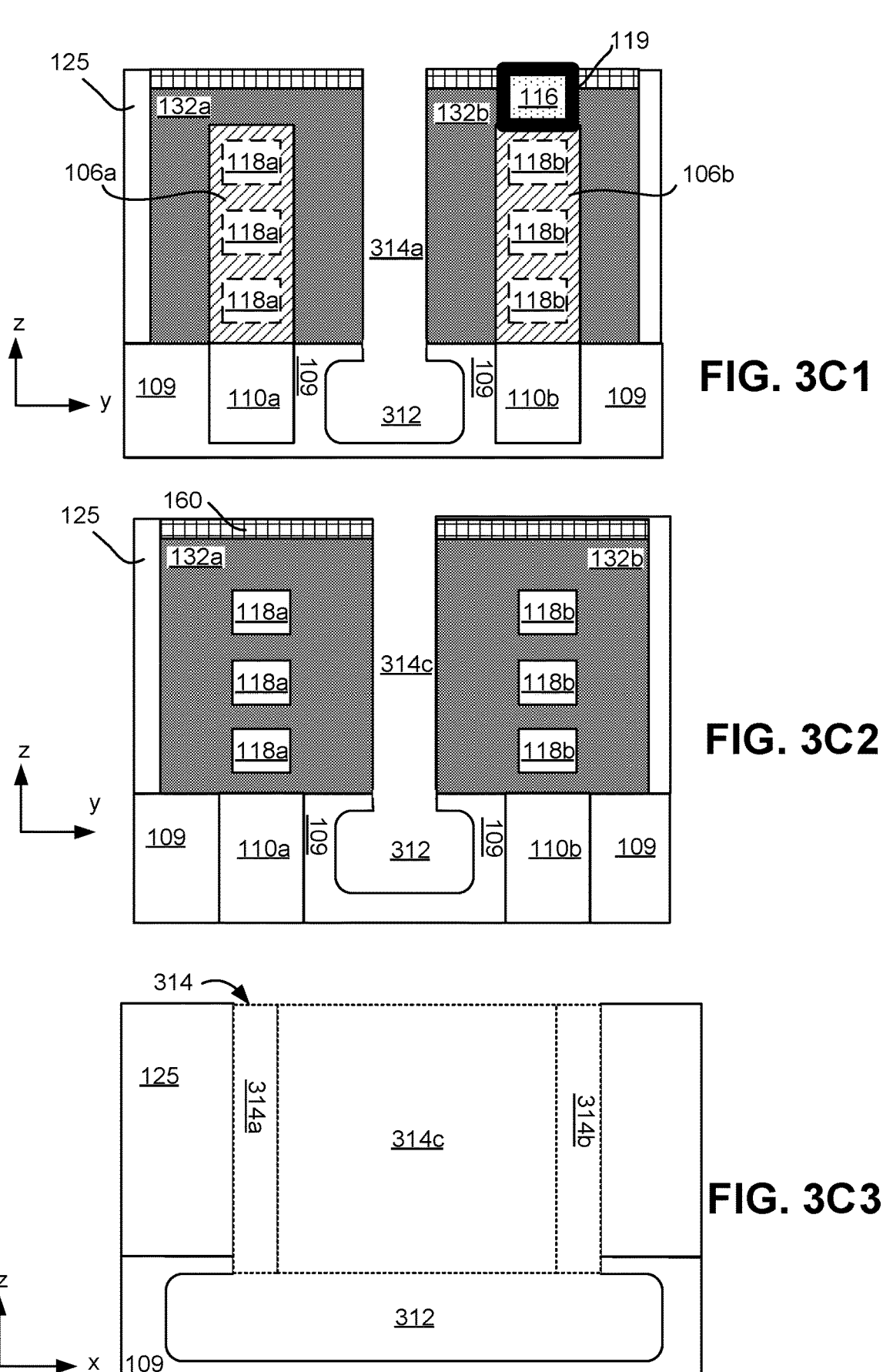
FIG. 3C1
FIG. 3C2
FIG. 3C3

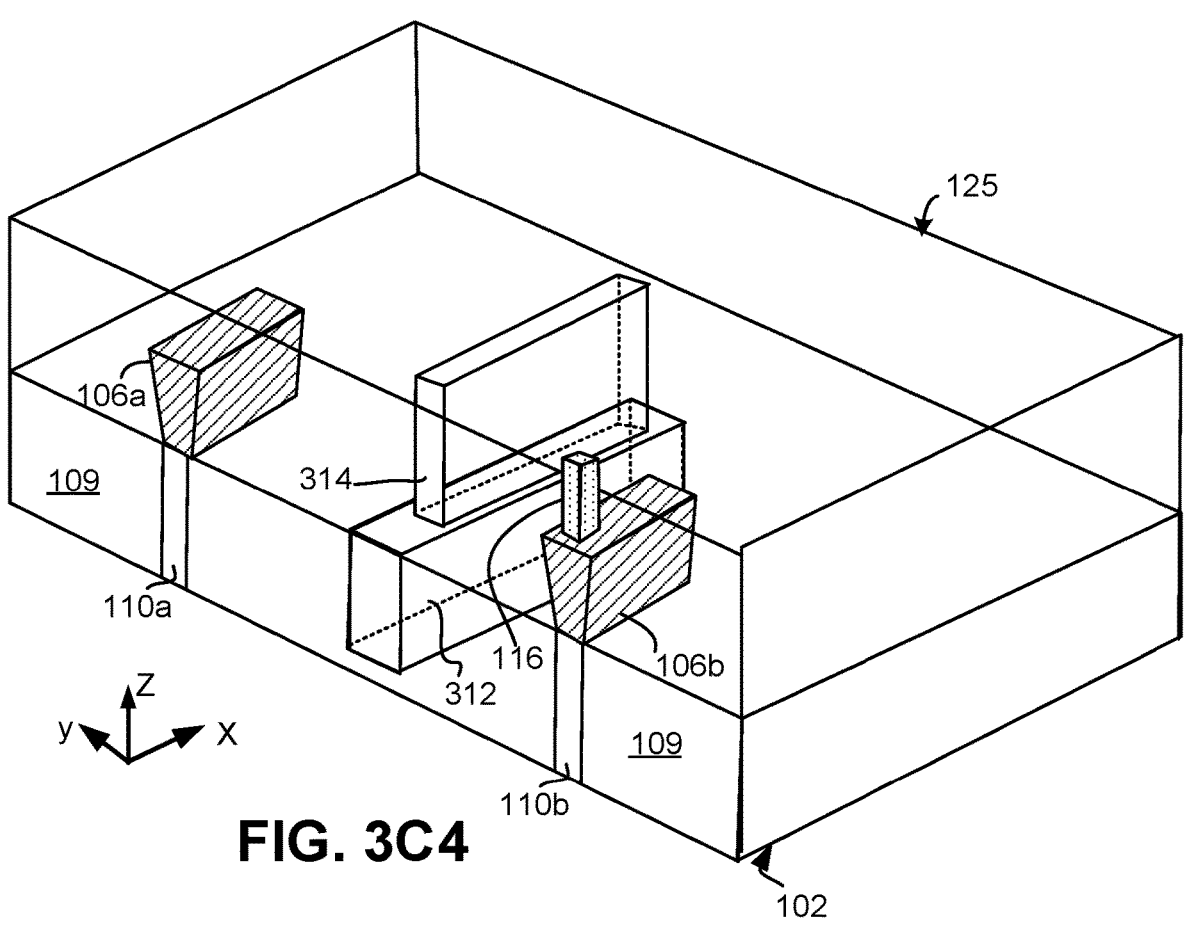
FIG. 3C4

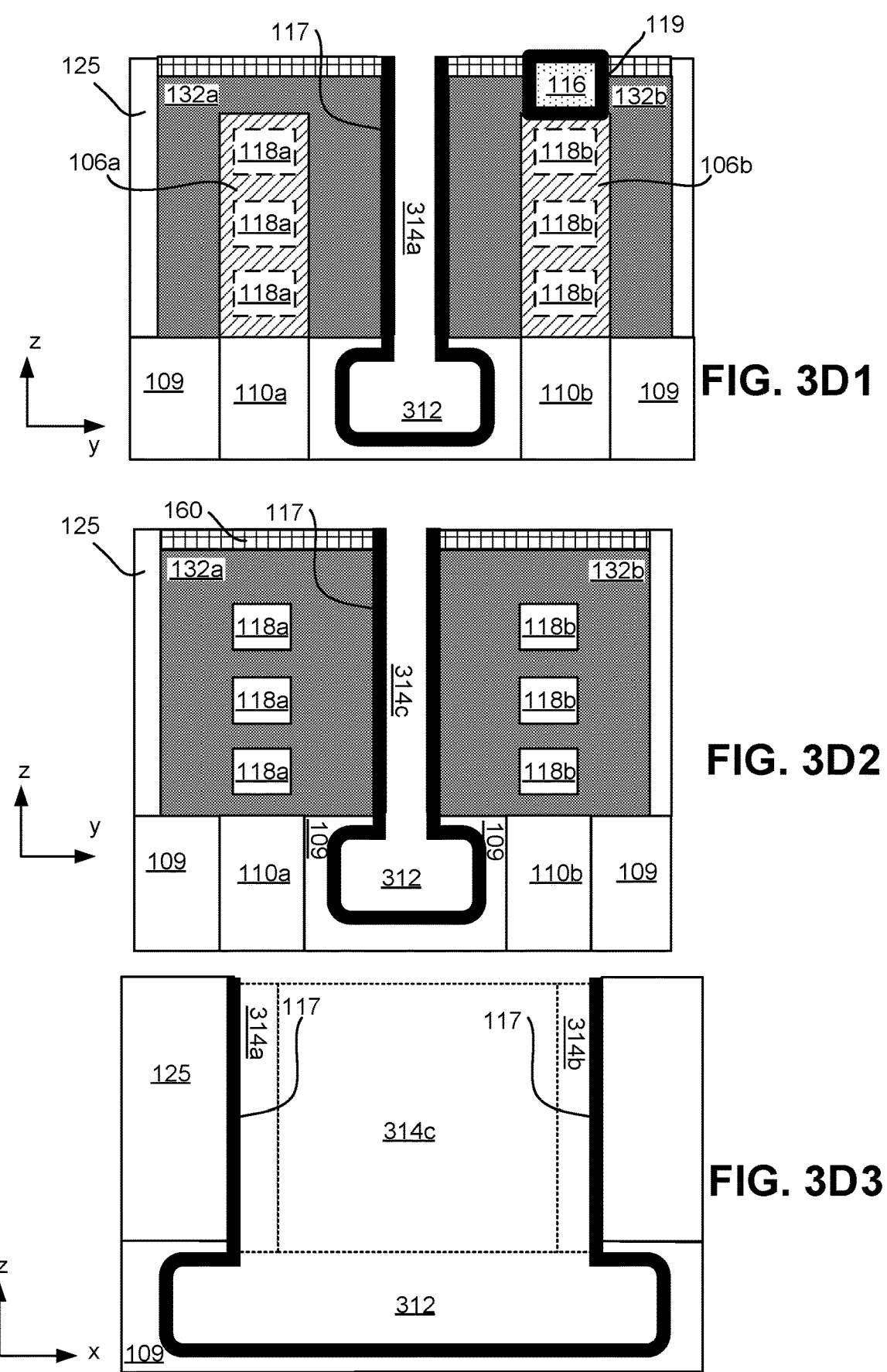
FIG. 3D1
FIG. 3D2
FIG. 3D3

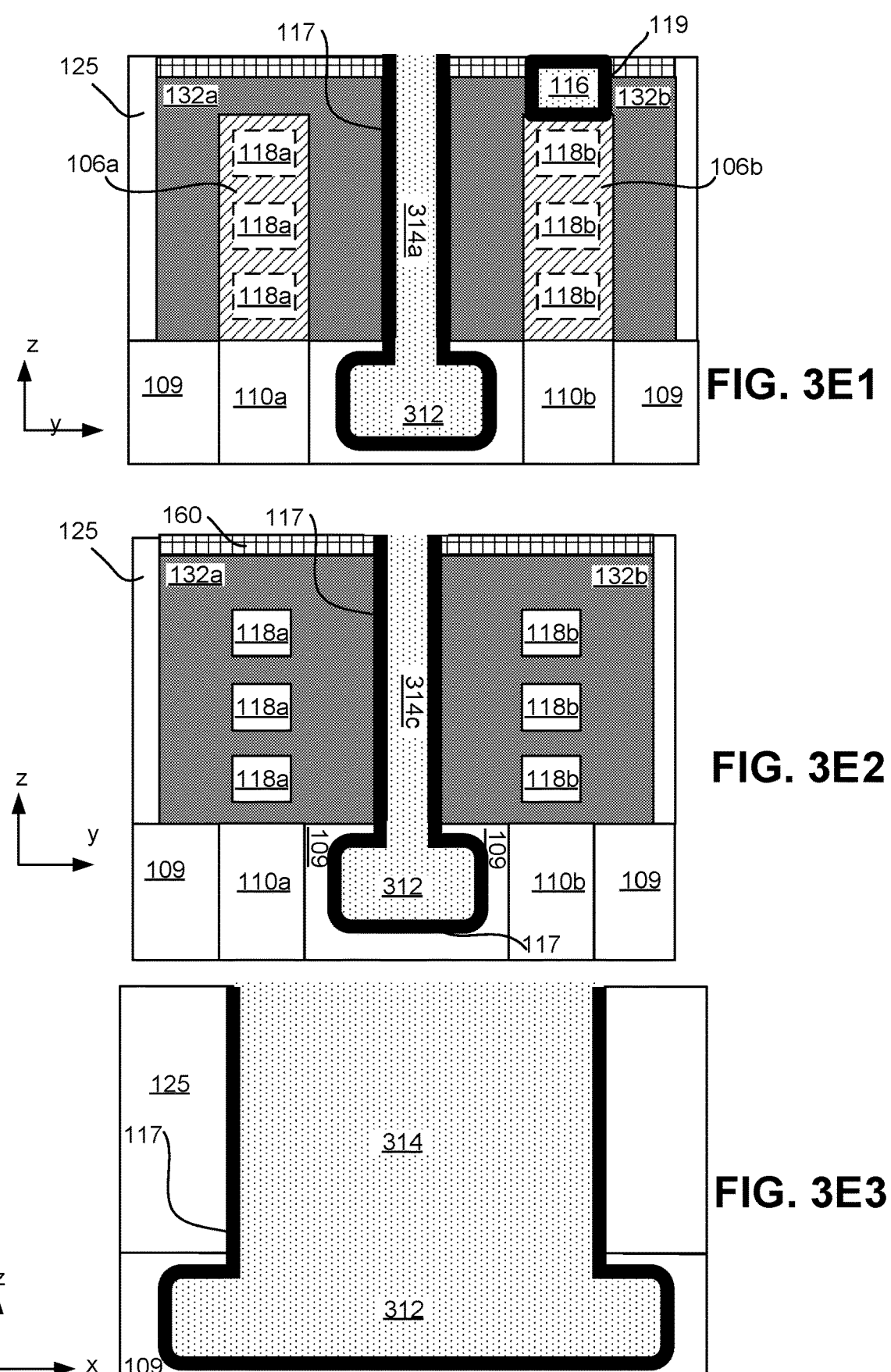
FIG. 3E1
FIG. 3E2
FIG. 3E3

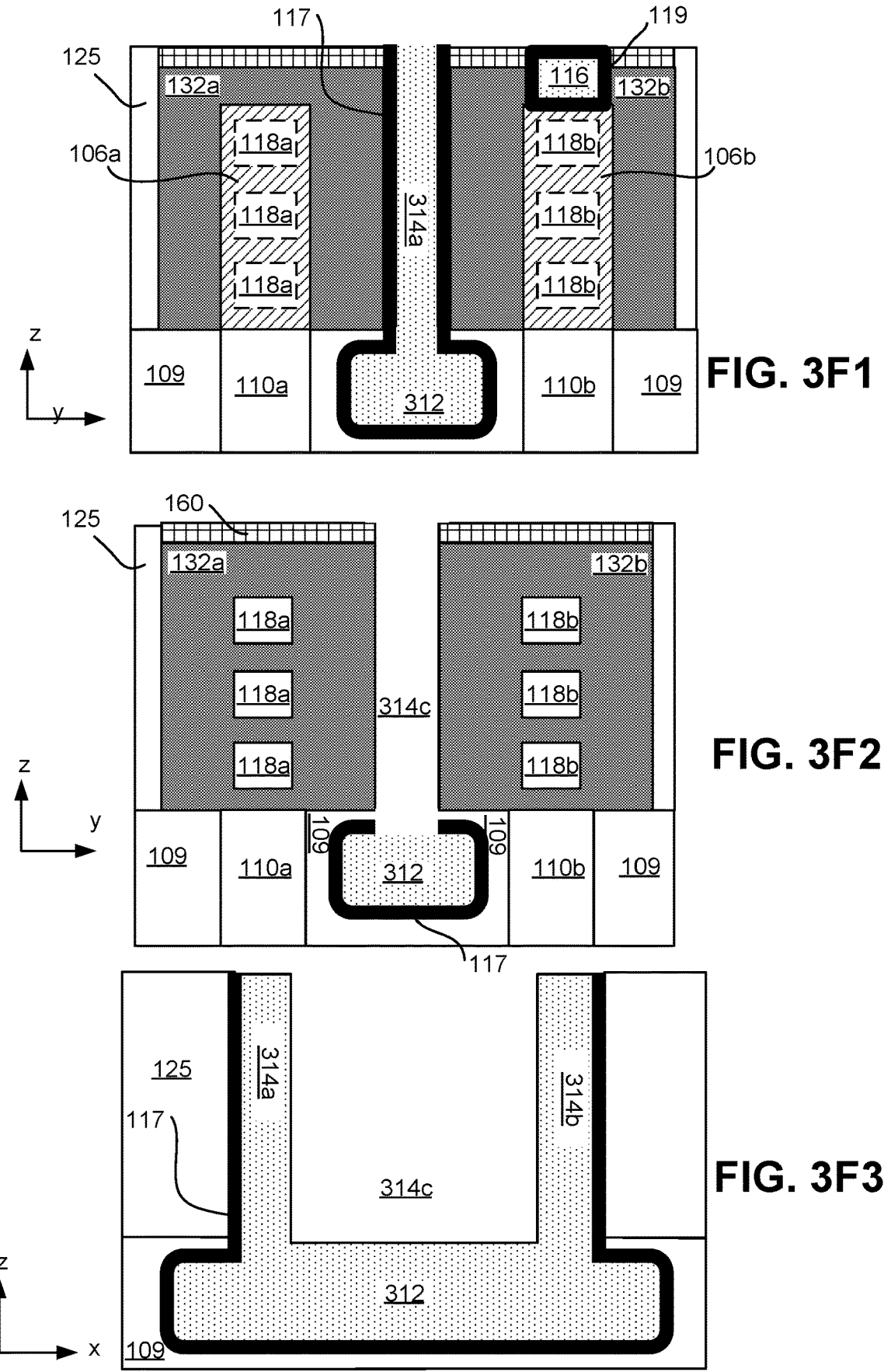
FIG. 3F1
FIG. 3F2
FIG. 3F3

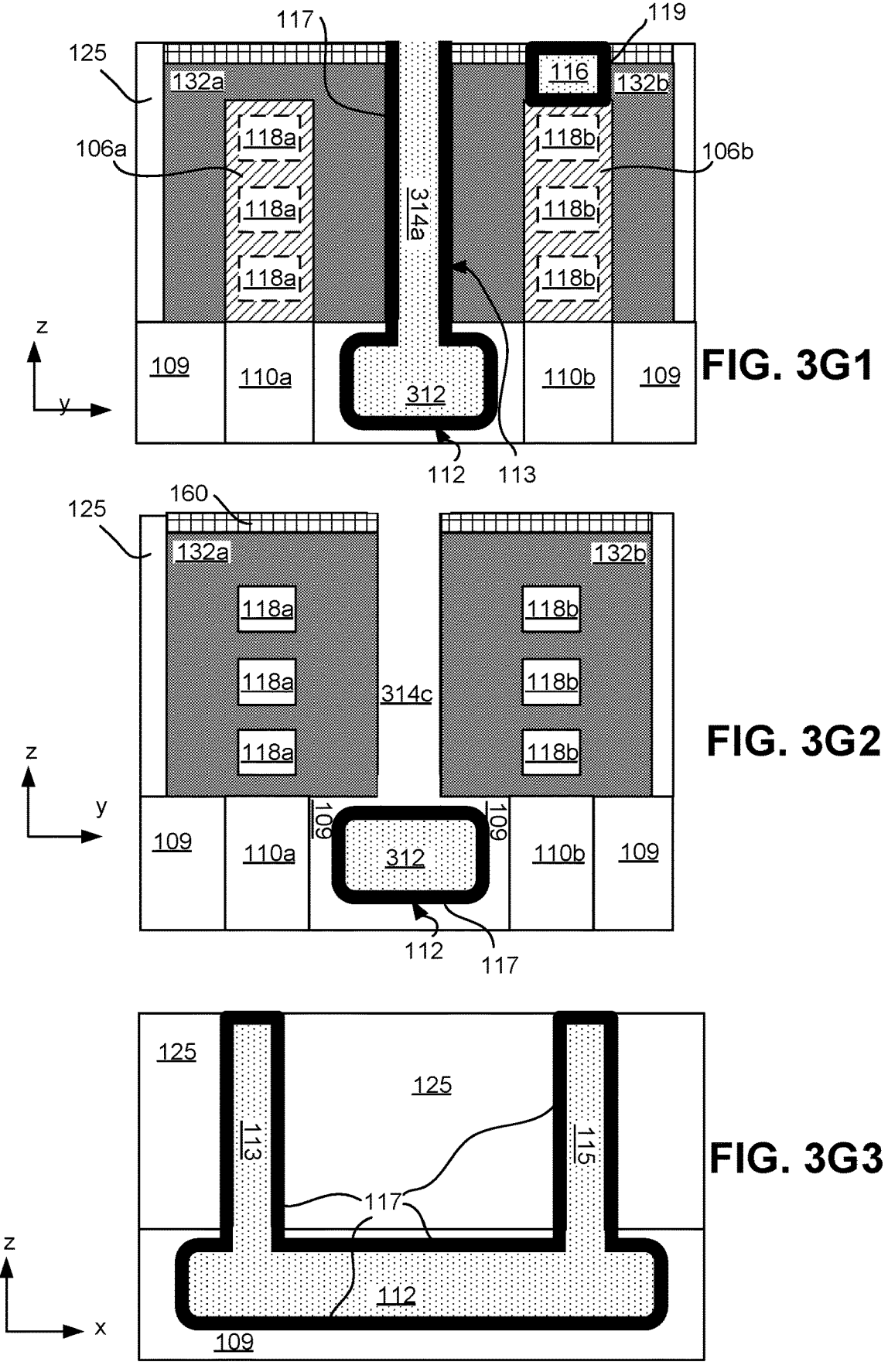
FIG. 3G1
FIG. 3G2
FIG. 3G3

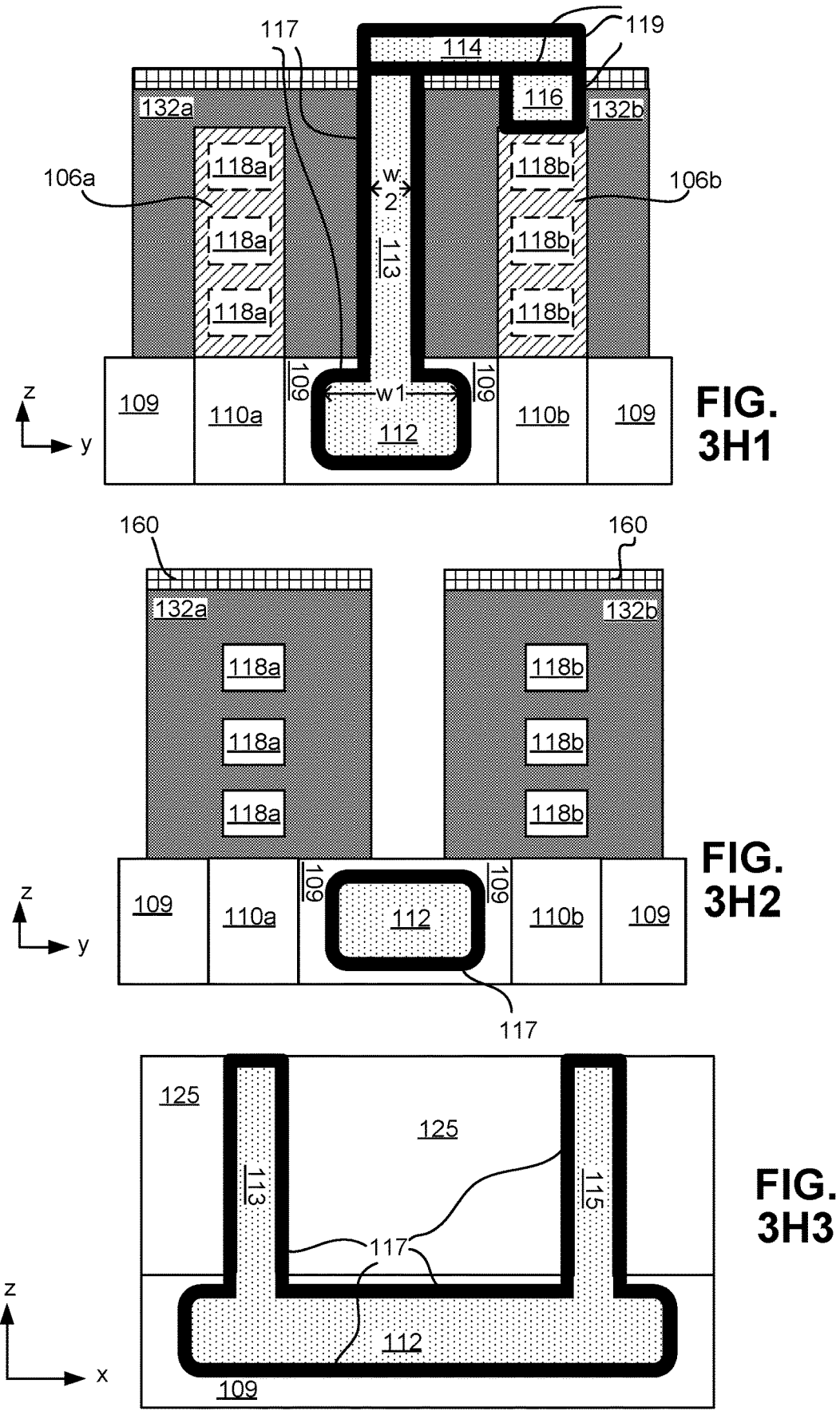
FIG. 3H1
FIG. 3H2
FIG. 3H3

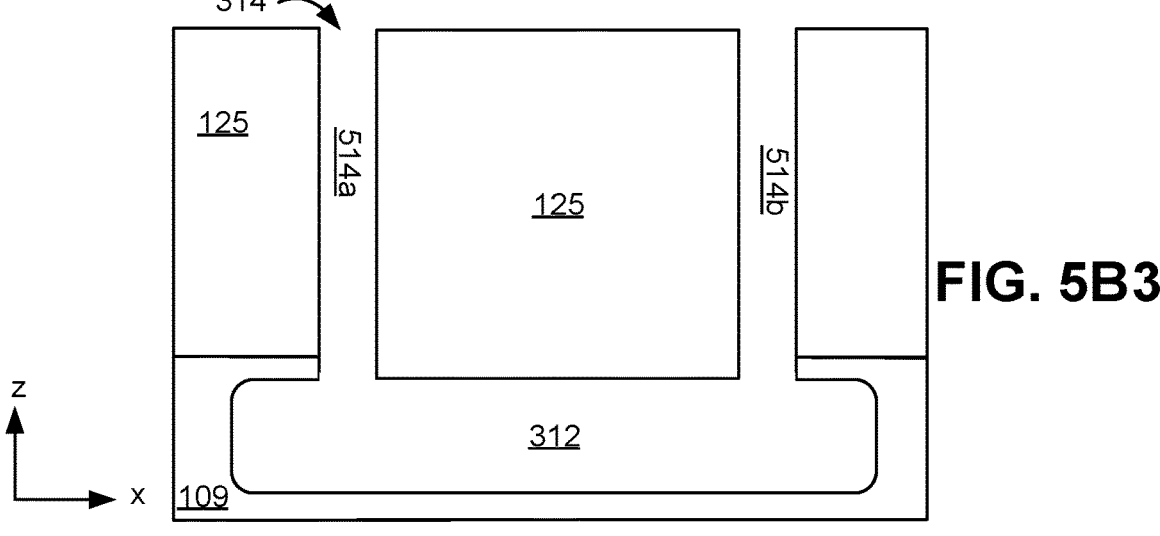
FIG. 5B1
FIG. 5B2
FIG. 5B3

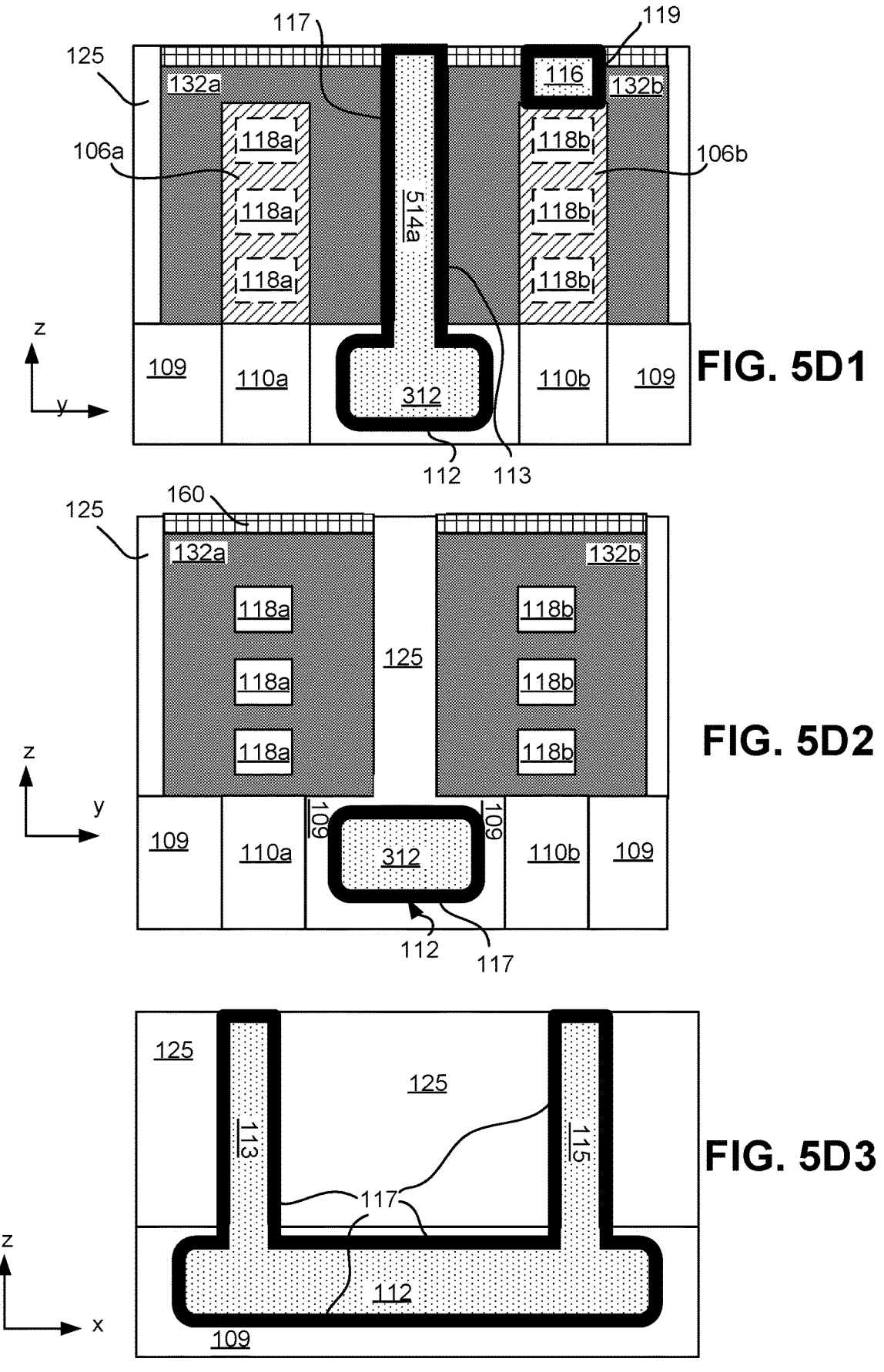
FIG. 5D1
FIG. 5D2
FIG. 5D3

REPLACEMENT VIA AND BURIED OR BACKSIDE POWER RAIL

BACKGROUND

Fabrication of microelectronic devices involves forming electronic components on microelectronic substrates, such as silicon wafers. These electronic components may include transistors, resistors, capacitors, and other active and passive devices, with overlying interconnect features (e.g., vias and lines) to route signals and power to and/or from the electronic components. Scaling of microelectronic devices results in high density of scaled interconnect features. To reduce congestion of interconnect features above the device layer comprising the electronic components, buried or backside power rail (BPR) architecture may be used. In some cases, BPR technology includes burying of conductors that deliver power (sometimes called power rails) to cells below the back end of line (BEOL) metal layers, usually in the same level as the device layer that includes semiconductor fins. In other cases, BPR technology includes forming such power rails on the backside of the substrate underneath the device layer. Such BPR configurations free-up overhead to make more room for logic connections and enable further scaling of a standard logic cell (e.g., memory and logic cells). BPR configurations also allow for relatively higher power rails (e.g., thicker), which in turn exhibit lower resistance and power dissipation. However, non-trivial issues remain with respect to implementing buried power rails, without incurring performance degradation.

BRIEF DESCRIPTION OF THE DRAWINGS

FIG. 2 illustrates a flowchart depicting a method of forming an integrated circuit (such as the 1C of FIGS. 1A-1F) comprising a BPR structure including a first interconnect feature, wherein a second interconnect feature supplies power to the first interconnect feature, and a third interconnect feature provides power from the first interconnect feature to a terminal of a device, wherein the first, second, and third interconnect features collectively form a continuous and monolithic body of conductive material, and wherein a continuous conformal barrier layer is on the walls of the first, second, and third interconnect features, in accordance with an embodiment of the present disclosure.

FIGS. 3A1, 3A2, 3A3, 3B1, 3B2, 3B3, 3C1, 3C2, 3C3, 3C4, 3D1, 3D2, 3D3, 3E1, 3E2, 3E3, 3F1, 3F2, 3F3, 3G1, 3G2, 3G3, 3H1, 3H2, and 3H3 illustrate various cross-sectional and perspective views of at least a section of an IC comprising the first, second, and third interconnect features of FIGS. 1A-2 in various stages of processing, in accordance with an embodiment of the present disclosure.

FIG. 4 illustrates a flowchart depicting another method of forming an integrated circuit comprising a BPR structure including a first interconnect feature, wherein a second interconnect feature supplies power to the first interconnect feature, and a third interconnect feature provides power from the first interconnect feature to a terminal of a device, wherein the first, second, and third interconnect features collectively form a continuous and monolithic body of conductive material, and wherein a continuous conformal barrier layer is on the walls of the first, second, and third interconnect features, in accordance with an embodiment of the present disclosure.

FIGS. 5A1, 5A2, 5A3, 5B1, 5B2, 5B3, 5C1, 5C2, 5C3, 5D1, 53D2, and 5D3 illustrate cross-sectional views of at least a section of an IC comprising the first, second, and third interconnect features of FIGS. 1A-1E and 4 in various stages of processing, in accordance with an embodiment of the present disclosure.

Figures 1A, 1B:
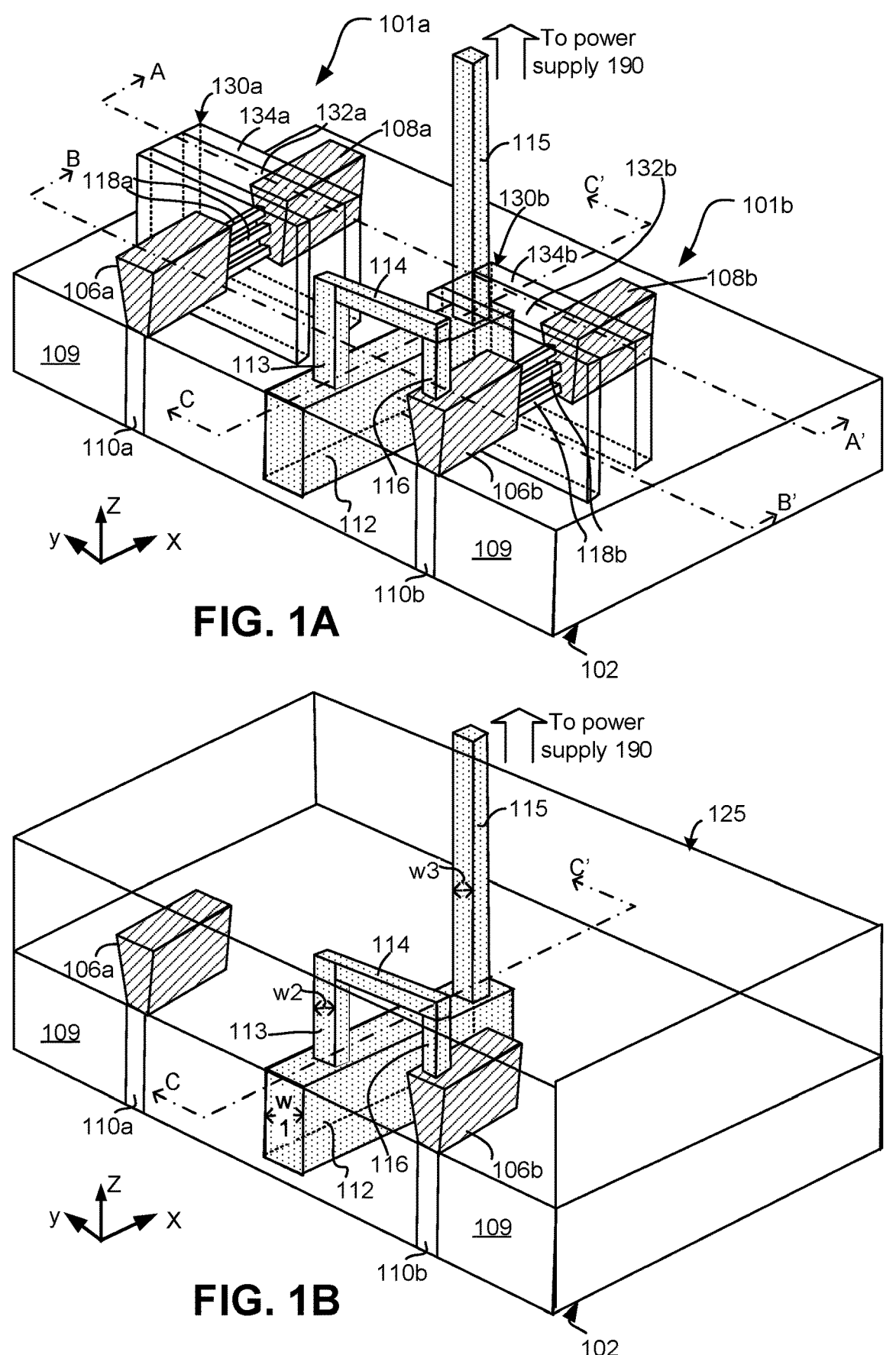
FIGS. 1A, 1B, 1C, 1D, 1E, and 1F illustrate various perspective, side, and plan views of an integrated circuit (IC) comprising a buried or backside power rail (BPR) structure including a first interconnect feature, wherein a second interconnect feature supplies power to the first interconnect feature, and a third interconnect feature provides power from the first interconnect feature to a terminal of a device, wherein the first, second, and third interconnect features collectively form a continuous and monolithic body of conductive material, and wherein a continuous conformal barrier layer is on the walls of the first, second, and third interconnect features, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles (e.g., curved or tapered sidewalls and round corners), and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

An integrated circuit structure including relatively low-resistance buried or backside power rail (BPR) is provided herein. In one embodiment, an integrated circuit structure comprises a first sub-fin, and a second sub-fin laterally spaced from the first sub-fin by a distance of 100 nm or less. The integrated circuit structure further comprises a first transistor device over the first sub-fin and having a first contact, a second transistor device over the second sub-fin and having a second contact, and a continuous and monolithic body of conductive material extending vertically between the first and second transistor devices and the first and second sub-fins. In an example, the body of conductive material has (i) an upper portion between the first and second transistor devices and (ii) a lower portion between the first and second sub-fins, the lower portion being at least 1.2 times wider than the upper portion. In some examples, the integrated circuit structure further comprises a continuous conformal layer that extends along a sidewall of the lower portion of the body and a sidewall of the upper portion of the body. In one such example, the continuous conformal layer does not separate the upper and lower portions of the body of conductive material. The integrated circuit structure further comprises a conductive interconnect feature connecting the upper portion of the body to at least one of the first and second contacts.

In another one embodiment, an integrated circuit structure comprises a substrate, and one or more dielectric layers above the substrate. One or more transistors are on the substrate. A first recess is at least in part within the substrate, and a second recess and a third recess are at least in part within the one or more dielectric layers. A continuous monolithic body of conductive material is within the first recess, the second recess, and the third recess. According to one such embodiment, a conductive interconnect feature couples the second recess with a terminal of a transistor of the one or more transistors.

In yet another embodiment, a method of forming interconnect features in an integrated circuit comprises forming a first recess within a substrate, depositing sacrificial material within the first recess, and forming (i) a first device having a first sub-fin region and (ii) a second device having a second sub-fin region. In an example, the first recess is laterally between the first sub-fin region and the second sub-fin region. In an example, dielectric material at least in part encapsulates the first and second devices. The method further comprises forming a second recess and a third recess within the dielectric material, where the second and third recesses lands on the first recess comprising the sacrificial material. Thus, the sacrificial material of the first recess is exposed through the second and third recesses. The method further comprises removing the sacrificial material of the first recess through any one or both the second and third recesses, and conformally depositing, through any one or both the second and third recesses, a barrier layer on walls of the first, second, and third recesses. The method further comprises depositing, through any one or both the second and third recesses, a monolithic and continuous body of conductive material within the first, second, and third recesses having the barrier layer on the walls. Thus, in an example, the method results in formation of a power rail within the first recess having the barrier layer and a first section of the body of conductive material, formation of a first interconnect feature within the second recess having the barrier layer and a second section of the body of conductive material, and formation of a second interconnect feature within the third recess having the barrier layer and a third section of the body of conductive material.

In a further embodiment, a method of forming interconnect features in an integrated circuit comprises forming a first recess within a substrate, depositing sacrificial material within the first recess, and forming a first device having a first sub-fin region and a second device having a second sub-fin region. In an example, the first recess is laterally between the first sub-fin region and the second sub-fin region. In an example, dielectric material at least in part encapsulates the first and second devices. The method further comprises forming a common recess within the dielectric material. The common recess lands on the first recess comprising the sacrificial material. Thus, the sacrificial material of the first recess is exposed through the common recess. The common recess has a first section, a second section, and an intermediate section laterally between the first and second sections. The method further comprises removing the sacrificial material of the first recess through the common recess, conformally depositing a barrier layer on walls of the first and common recesses, and depositing a monolithic and continuous body of conductive material within the first and common recesses having the barrier layer on the walls. The method further comprises removing a portion of the body of conductive material from the intermediate section of the common recess, without removing conductive material from the first or second sections of the common recess. Thus, in an example, the method results in formation of a power rail within the first recess having a first section of the body of conductive material, formation of a first interconnect feature within the first section of the common recess having a second section of the body of conductive material, and formation of a second interconnect feature within the second section of the common recess having a third section of the body of conductive material.

Numerous variations, embodiments, and applications will be apparent in light of the present disclosure.

General Overview

As previously noted, non-trivial issues remain with respect to forming buried or backside power rails (BPR), without incurring performance degradation. For instance, if a BPR is integrated before formation of a transistor ("BPR-first" integration scheme), conductive material used for the BPR has to withstand high thermal budget during formation of the transistor, and such conductive material may have relatively high resistivity. Also, barrier or liner layers between the BPR and other interconnect features add to the resistance. In another example, a BPR may be integrated after formation of the transistor ("BPR-last" integration scheme). While this BPR-last integration scheme enables use of materials that don't need to withstand high thermal budget during transistor gate stack formation, design rule limitations on the dimensions for the power rail result in relatively high resistance of the power rail.

Accordingly, techniques are provided herein to form relatively low-resistance buried or backside power rails (BPRs). In an embodiment, a dummy BPR is formed prior to integration of two adjacent transistors. For example, the two transistors may be any appropriate type of nonplanar transistors, such as gate all around transistors in which the gate structure wraps around channel region comprising nanoribbons or nanosheets (or nanowires), or other nonplanar transistors such as forksheet transistors, FinFET transistors. Each transistor has a corresponding sub-fin region, and the dummy BPR is formed in a first recess within a substrate, where the first recess is laterally between the two sub-fin regions of the two transistors. The dummy BPR includes sacrificial material. The sacrificial material can be a material that can be selectively etched with respect to the material in which the recess is formed. For instance, the recess can be formed in an oxide (e.g., silicon dioxide), and the dummy BPR can be formed of a nitride (e.g., silicon nitride) or a carbide (e.g., silicon carbide).

After the integration of the two transistors is at least in part complete (e.g., after completion of a replacement gate stack of the transistor), at least a second recess and a third recess are formed over the dummy BPR and within an interlayer dielectric (ILD) that encapsulates the two transistors, such that both the second and third recesses conjoin with the first recess of the dummy BPR. Thus, the second and third recesses land on the first recess comprising the sacrificial material, and the sacrificial material of the first recess is exposed through the second and third recesses. Subsequently, the sacrificial material within the first recess of the dummy BPR is selectively removed through one or both the second and third recesses. Note that the ILD layer in which the second and third recesses are formed can be the same material as the layer in which the recess in which the BPR was formed (e.g., such as silicon dioxide).

After removal of the sacrificial material, a barrier layer (or liner layer or encapsulation layer) is conformally deposited on walls of the first, second, and third recesses, where the deposition is through the second and/or third recesses. Note that the barrier layer is conformally deposited in a single process flow in the recesses. Accordingly, there is no seam or discontinuity between the barrier layer of the first recess, the barrier layer of the second recess, and the barrier layer of the third recess. Further note that the barrier layer can have a uniform width throughout the first, second, and third recesses. For example, a thickness of the barrier layer is in the range of about 0.5 to 4 nm and varies at most by 5% or 10% throughout the first, second, and third recesses.

After deposition of the barrier layer, conductive material is deposited within the first, second, and third recesses during a single deposition process. Thus, there is no barrier layer or seam between conductive materials of the first, second, and third recesses, and the conductive material within the first, second, and third recesses is continuous and monolithic. This reduces resistance between the conductive materials of the first, second, and third, recesses.

Note that in an example and as discussed herein above (and also discussed later with respect to FIG. 4), the second and third recesses are formed separately and remains separate during removal of the sacrificial material and deposition of the liner layer and the conductive material. However, in another example (and also discussed later with respect to FIG. 2), instead of separately forming the second and third recesses, a common big recess is formed that lands on the first recess, where the common recess includes a section for the second recess and another section for the third recess. Subsequently, sacrificial material of the first recess is selectively removed, and the continuous and conformal barrier layer and the monolithic conductive material are deposited through this common recess. Later on, conductive material and the barrier layer are selectively removed from a middle section of the common recess, and the resultant space is filed with interlayer dielectric (ILD) material, thereby separating the second and third recesses.

In an example, conductive material within the various recesses tends to diffuse through adjacent dielectric material. In an example where the conductive material is copper, the diffusion may result in formation of undesirable copper oxide. The continuous and conformal barrier layer, in an example, prevents diffusion of the conductive material (such as copper) to dielectric material adjacent to the recesses. Furthermore, the barrier layer facilitates better adhesion of the conductive material on walls of the recesses.

The conductive material within the first recess forms the BPR. The conductive material within the second recess forms a first interconnect feature to receive power from a power supply source. Similarly, conductive material within the third recess forms a second interconnect feature to supply the power to a terminal of one of the two transistors, such as a source, drain, or gate terminal of a transistor.

Thus, as discussed, the first recess comprising the BPR is laterally between the two sub-fin regions of the two transistors. The first interconnect feature supplying power from the power supply to the BPR extends vertically from the BPR, and extends above a level of the two transistors. The first interconnect feature routes power from the power supply to the BPR. The second interconnect feature supplying power to the terminal of one of the two transistors extends vertically from the BPR, and is laterally between the two transistors. For example, the second interconnect feature supplying power to the terminal of one of the two transistors extends vertically from the BPR, and another horizontal interconnect feature between the second interconnect feature and the terminal supplies power from the second interconnect feature to the terminal.

Because the conductive material of the power rail and the first and second interconnect features are deposited after completion of the adjacent transistors, the conductive material need not withstand high thermal budget of the transistor formation process. Accordingly, in an example, low thermal budget material having low resistance, such as copper, may be used for the conductive material. Additionally, the conductive material of the power rail and the first and second interconnect features is monolithic, without any seam or barrier layer therebetween, which reduces resistance between the power rail and the first and second interconnect features, thereby improving performance of the integrated circuit.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Use of the techniques and structures provided herein may be detectable using tools such as electron microscopy including scanning/transmission electron microscopy (SEM/TEM), scanning transmission electron microscopy (STEM), nario-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may be used to detect a monolithic continuous body of conductive material of a BPR, a conductive interconnect feature to supply power to the BPR, and another conductive interconnect feature to transmit the power from the BPR to a terminal of a transistor; and continuous conformal barrier layer on walls of the BPR and the two conductive interconnect features. In particular, in some embodiments, such tools may also be used to detect a location of the BPR relative to the transistor to which the power is being supplied. For example, the BPR is laterally between a sub-fin region of the transistor and a sub-fin region of another transistor.

Numerous configurations and variations will be apparent in light of this disclosure.

Architecture and Methodology

Figure 1C:
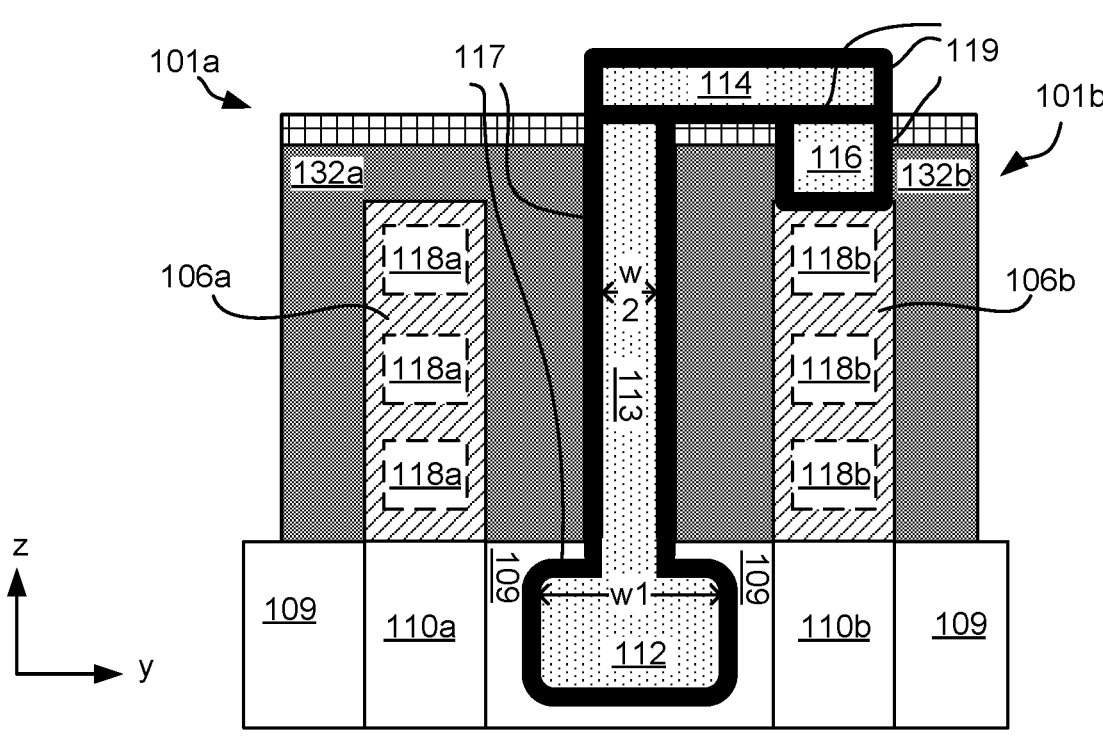
Figure 1D:
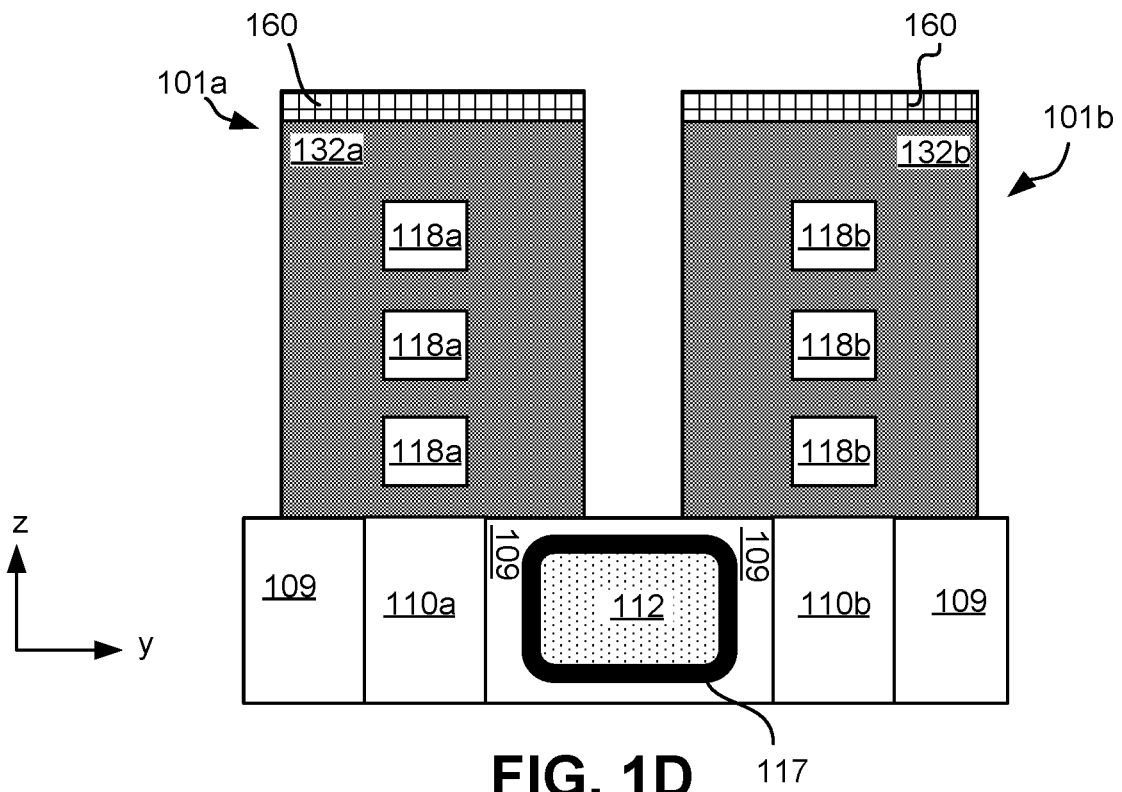
Figure 1E:
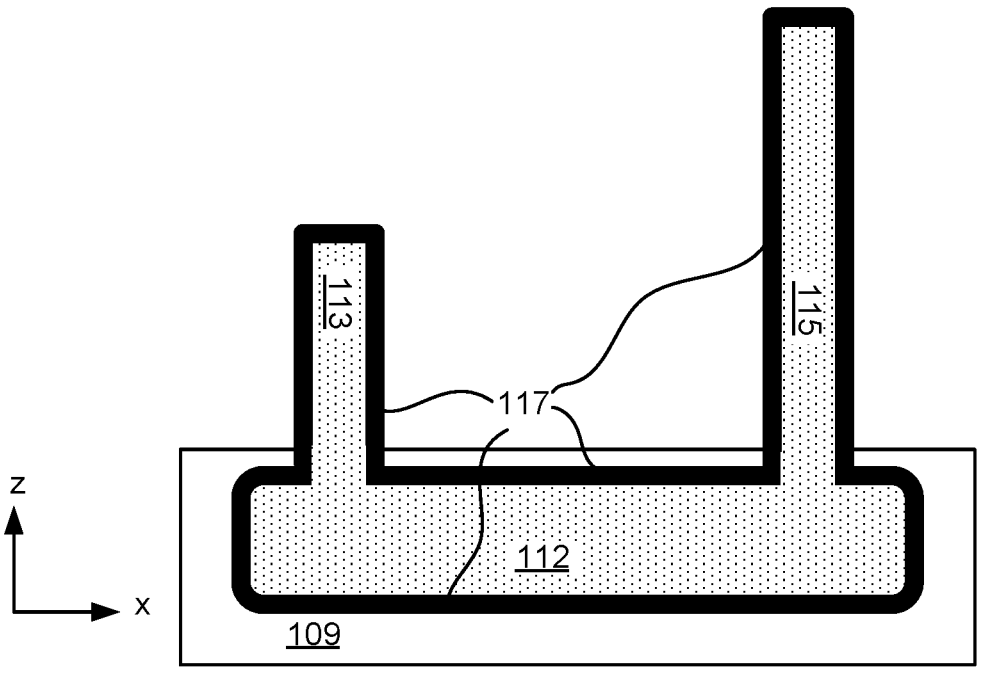
Figure 1F:
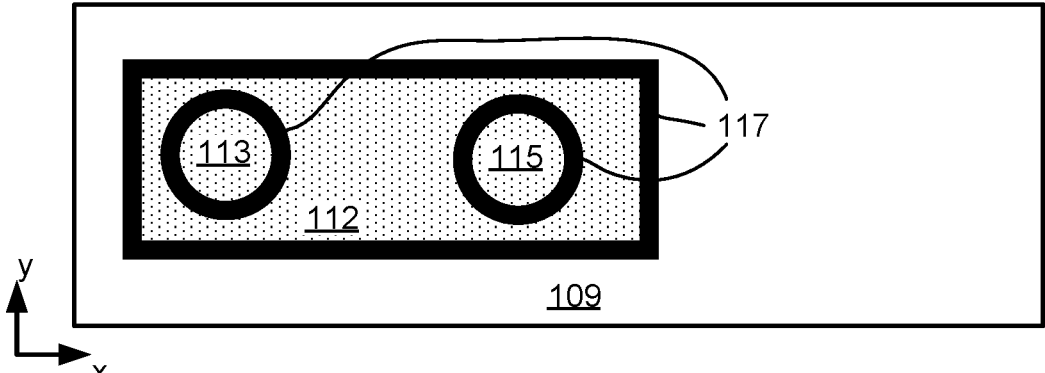

FIG. 1A illustrates a perspective view of an integrated circuit (IC) 100 comprising a buried or backside power rail structure including a first interconnect feature 112, wherein a second interconnect feature 115 supplies power to the first interconnect feature 112, and a third interconnect feature 113 provides power from the first interconnect feature 112 to a terminal 116 of a device (such as a transistor) 101*b*, wherein at least the first, second, and third interconnect features collectively form a continuous and monolithic body of conductive material, and wherein a continuous conformal barrier layer 117 is on the walls of the first, second, and third interconnect features, in accordance with an embodiment of the present disclosure. FIG. 1B illustrates another perspective view of the various interconnect features of the integrated circuit 100 of FIG. 1A in further detail, in accordance with an embodiment of the present disclosure. FIGS. 1C, 1D, and 1E illustrate side views of the integrated circuit 100 of FIG. 1A, and FIG. 1F illustrates a plan view of the first, second, and third interconnect features of the integrated circuit 100 of FIG. 1A, in accordance with an embodiment of the present disclosure.

The cross-sectional view of FIG. 1C is along line B-B' of FIG. 1A, the cross-sectional view of FIG. 1D is along line A-A' of FIG. 1A, and the cross-sectional view of FIG. 1E is along line C-C' of FIGS. 1A and 1B.

FIG. 1A does not illustrate some components of the IC 100, such as an interlayer dielectric (ILD) layer 125, which is illustrated in FIG. 1B. Similarly, FIG. 1B illustrates only some components of the IC 100, such as various interconnect features, base or substrate 102, source/drain regions 106*a*, 106*b*, etc.

Referring to FIGS. 1A-1F, the IC 100 comprises devices 101*a*, 101*b*. In the illustrated examples of FIGS. 1A-1F, the devices 101*a*, 101*b* are gate all around (GAA) transistors, such as nanoribbon transistors. However, in another example, the devices 101*a* and/or 101*b* can be any other appropriate type of GAA transistors, such as nanowire transistors, nanosheet transistors. In yet another example, the devices 101*a* and/or 101*b* can be any other appropriate type of non-planar transistors, such as forksheet transistors, FinFETs, or other appropriate type of transistors. The teachings of this disclosure are not limited to the devices 101*a* and/or 101*b* being any specific type of transistor(s).

In the example of FIGS. 1A-1F, the device 101*a* has a source region 106*a*, a drain region 108*a*, and gate electrode 132*a*. Similarly, the device 101*b* has a source region 106*b*, a drain region 108*b*, and gate electrode 132*b*. The devices 101*a*, 101*b* are formed on a base or substrate 102. Any number of semiconductor devices can be formed on the substrate 102, although only two such devices 101*a*, 101*b* are illustrated as an example. In an example, the substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, any of the substrates can be a semiconductor-on-insulator (SOI) substrate having a desired semiconductor layer over a buried insulator layer (e.g., silicon over silicon dioxide). Alternatively, the substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used.

Each of the devices 101*a*, 101*b* includes corresponding channel region laterally extending between and connecting corresponding source region 106 and drain region 108. The channel region includes two or more channel bodies, such as nanoribbons 118, that extend horizontally and are arranged in a vertical stack. For example, the device 101*a* comprises a plurality of nanoribbons 118*a* extending laterally between corresponding source region 106*a* and drain region 108*a*, and the device 101*b* comprises a plurality of nanoribbons 118*b* extending laterally between corresponding source region 106*b* and drain region 108*b*. Although each of the devices 101*a*, 101*b* is illustrated to include three nanoribbons, the channel region of each of the devices can have any different number of nanoribbons, such as one, two, four, or higher. Although the nanoribbons 118 extend horizontally and are stacked vertically in each device, the present disclosure contemplates nanoribbons in a variety of configurations that include planar nanoribbon transistors, nanoribbons that extend vertically and are stacked horizontally, and other arrangements, as will be appreciated. In an example, the nanoribbons 118 comprise an appropriately doped semiconductor material, such as appropriately doped silicon. Note that in the side view of FIG. 1C the nanoribbons 118*a*, 118*b* would not be visible through the corresponding source regions 106*a*, 106*b*, respectively, and hence, the nanoribbons 118*a*, 118*b* are illustrated using dotted lines in FIG. 1C.

The device 101*a* includes a sub-fin region 110*a*, above which the nanoribbons 118*a* of the device 101*a* are vertically stacked. Similarly, the device 101*b* includes a sub-fin region 110*b*, above which the nanoribbons 118*b* of the device 101*b* are vertically stacked. According to some embodiments, sub-fin regions 110*a*, 110*b* comprise the same semiconductor material as the substrate 102. As illustrated, each device 101 may be separated from any adjacent device by a dielectric fill 109. Dielectric fill 109 provides shallow trench isolation (STI) between any adjacent semiconductor devices. Dielectric fill 109 can be any suitable dielectric material, such as silicon dioxide, aluminum oxide, or silicon oxycarbonitride.

In the device 101*a*, a gate structure 130*a* contacts and at least in part surrounds each nanoribbon 118*a* between the source and drain regions 106*a*, 108*a*, where the gate structure 130*a* includes gate dielectric (not illustrated), a gate electrode 132*a*, inner gate spacers (not illustrated), and gate spacers 134*a*. Similarly, in the device 101*b*, a gate structure 130*b* contacts and at least in part surrounds each nanoribbon 118*b* between the source and drain regions 106*b*, 108*b*, where the gate structure 130*b* includes gate dielectric (not illustrated), a gate electrode 132*b*, inner gate spacers (not illustrated), and gate spacers 134*b*.

In an example, each nanoribbon 118 comprise a middle region between two end regions. For example, a first end region of a nanoribbon is in contact with and abuts the corresponding source region and inner gate spacer, and a second end region of a nanoribbon is in contact with and abuts the corresponding drain region and inner gate spacer. The dielectric layer wraps around the middle region of individual nanoribbons, but doesn't wrap around the end regions of individual nanoribbons. According to some embodiments, the gate electrode 132*a* extends over and wraps around the nanoribbons 118*a* in the device 101*a*, and the gate electrode 132*b* extends over and wraps around the nanoribbons 118*b* in the device 101*b*. Gate electrodes 132*a*, 132*b* may include any sufficiently conductive material such as a metal, metal alloy, or doped polysilicon. Although not illustrated, in each of the devices 101a, 101b, the gate structure also includes inner gate spacers that is laterally between and that separate the corresponding source region and the corresponding gate electrode, as well as laterally between and that separate the corresponding drain region and the corresponding gate electrode.

In one embodiment, the device 101a comprises the sub-fin region 110a and the device 101b comprises the sub-fin region 110b. In an example, the two sub-fin regions 110a, 110b are spaced from each other by a distance of 200 nm or less, 150 nm or less, 100 nm or less, 50 nm or less, 25 nm or less, 15 nm or less, 10 nm or less, or between 5-8 nm or less. In an example, at least a section of the interconnect feature 112 is laterally between the first and second sub-fin regions 110a, 110b. The interconnect feature 112, thus, is buried at or below a level of the transistor devices 110a, 110b. For example, the interconnect feature 112 is buried within or below a device layer of the IC 100.

In one embodiment, various interconnect features 112, 113, 114, 115, and 116 illustrated in FIGS. 1A-1F are to supply power to the source 106b of the device 101b. Although not illustrated, in an example, the interconnect features may instead supply power to any other terminal of the devices 101a, 101b, such as the source 106a, drain 108a, or gate electrode 132a of the device 101a, or the drain 108b or gate electrode 132b of the device 101b. In an example, similar to the interconnect features discussed herein, there may be one or more other interconnect features to supply power to various other terminals of the devices 101a, 101b.

In an example, the interconnect feature 112 is a buried or backside power rail (BPR), as the interconnect feature 112 is a power rail supplying power to a terminal (e.g., source 106a) of the device 101b and as the interconnect feature 112 is buried within or underneath a device layer of the IC 100. For example, the interconnect feature 112 is buried within the substrate 102 at, for example, a sub-fin level of the devices 101a, 101b.

The interconnect feature 112 receives power from a power supply 190 (not illustrated), through the interconnect feature 115. The interconnect feature 112 provides the power to the source region 106b of the device 101b, e.g., through a vertical interconnect feature 113. For example, a source contact 116 is coupled to the source region 106b. A horizontal interconnect feature 114 couples the interconnect feature 113 with the source contact 116. Thus, the interconnect feature 112 supplies power form the power supply 190 to the source region 106b, through the interconnect features 115, 113, 114, and the source contact 116. Note that while the figures illustrate an example layout of the various interconnect features, such a layout is merely an example and is not intended to limit the scope of this disclosure.

The interconnect features 112, 113, 115 have widths of w1, w2, and w3, respectively, where the widths are labelled in FIGS. 1B and 1C. In an example, the widths w1, w2, w3 are measured in a direction that is perpendicular to a length of nanoribbons 118a, 118b of the devices 100a, 100b. In an example, the width w1 is greater than w2. In an example, the width w1 is greater than w3. For example, w1 is at least 110% greater, at least 120% greater, at least 140% greater, at least 150% greater, at least 180% greater, or at least 200% greater than the width w2. In an example, w1 is at least 110% greater, at least 120% greater, at least 140% greater, at least 150% greater, at least 180% greater, or at least 200% greater than the width w3. Thus, in an example, the interconnect feature 112 is wider than the interconnect features 113 and/or 115.

However, in another example, the width w1 is substantially similar to the widths w2 and/or w3. In an example, the width w1 is within 1%, 2%, 5%, 10%, or 20% of one or both the widths w2 or w3.

In an example, the interconnect features 112, 113, 114, and 115 comprise suitable conductive material, such as pure copper, ruthenium, molybdenum, tungsten, an alloy such as copper-tin (CuSn), copper indium (CuIn), copper-antimony (CuSb), aluminum, copper-bismuth (CuBi), copper-rhenium (CuRe), and/or any other suitable conductive material.

As illustrated in FIGS. 1C and 1E, the interconnect features 112, 113, and 115 comprise a continuous and monolithic body of conductive material. For example, there is no seam, barrier layer, liner layer, or capping layer between the conductive materials of the interconnect features 112, 113, and 115. For example, because of the manner in which the interconnect features 112, 113, and 115 are formed, as will be discussed herein later, conductive materials of these interconnect features 112, 113, and 115 are formed without any barrier or capping layers therebetween.

In contrast, in an example and as illustrated in FIG. 1C, barrier layers 117 and/or 119 may be present between the conductive materials of the interconnect features 113 and 114, and between the conductive materials of the interconnect features 114 and 116. However, although not illustrated in the figures, in another example, the barrier layer 117 may be absent between the conductive materials of the interconnect features 113 and 114, and/or between the conductive materials of the interconnect features 114 and 116

In one embodiment, barrier layer 117 extends along the walls of the interconnect features 112, 113, and 115. Similarly, layer 119 extends along the walls of the interconnect features 114 and 116.

In an example, the layer 117 on walls of the interconnect features 112, 113, 115 is a continuous and conformal layer. For example, the layer 117 on walls of the interconnect features 112, 113, 115 may be formed during a single conformal deposition process, and hence, is a continuous and conformal layer.

Note that the layer 117 on walls of the interconnect features 112, 113, 115 and the layer 119 of the walls of the interconnect features 114 and 116 may be formed at different deposition processes. Accordingly, the layer 117 and the layer 119 may, or may not, be conformal and continuous. However, as discussed, as the layer 117 on walls of the interconnect features 112, 113, 115 may be formed during a single conformal deposition process, the layer 117 is a continuous and conformal layer. Note that while FIG. 1C-1F illustrate the layers 117, 119, these layers are not illustrated in FIGS. 1A-1B for purposes of illustrative clarity.

As illustrated in FIGS. 1C, 1D, and 1E, the layer 117 is on a top wall of the interconnect feature 112. Note that in the plan view of FIG. 1F, the layer 117 on the top wall of the interconnect feature 112 is not illustrated, and instead the conductive material of the interconnect feature 112 underneath the layer 117 on top wall is illustrated. As illustrated in FIGS. 1C-1F, the layer 117 is on sidewalls, bottom surface, and top wall of the interconnect feature 112. Similarly, the layer 117 is on sidewalls and top wall of the interconnect feature 113. Note that the bottom surface of the interconnect feature 113 is on the interconnect feature 112 (see FIGS. 1C and 1E), and hence, the layer 117 is absent on the bottom surface of the interconnect feature 113. For example, the layer 117 is absent between the conductive materials of the interconnect features 112, 113. Similarly, the layer 117 is on sidewalls and top wall of the interconnect feature 115. Note that the bottom surface of the interconnect feature 115 is on the interconnect feature 112 (see FIGS. 1A, 1B, and 1E), and the layer 117 is absent on the bottom surface of the interconnect feature 115. For example, the layer 117 is absent between the conductive materials of the interconnect features 112, 115. Similarly, the layer 119 is on top walls, bottom walls, and sidewalls of the interconnect features 114 and 116.

In one embodiment, the layers 117, 119 act as a liner or barrier layer, as well as a capping (or encapsulation) layer. For example, conductive material within various interconnect features tends to diffuse through adjacent dielectric material. In an example where the conductive material is copper, the diffusion may result in formation of undesirable copper oxide. The layers 117, 119, in an example, prevents diffusion of the conductive material (such as copper) to dielectric material adjacent to the interconnect features. Furthermore, the layers 117, 119 facilitate better adhesion of the conductive material on walls of the interconnect features.

In an example, each of the layers 117, 119 has a width or thickness in the range of 1 to 5 nanometers (nm), or 1 to 10 nm, or 0.5 to 10 nm. Suitable materials for the layers 117, 119 include barrier layer refractory metals and alloys, cobalt, cobalt-nickel (CoNi), ruthenium-cobalt combination, molybdenum, nickel, manganese, titanium-tungsten (Ti), tantalum (Ta), tantalum-nitride (TaN), tantalum-silicon-nitride (TaSiN), titanium-nitride (TiN), titanium-silicon-nitride (TiSiN), tungsten (XV), tungsten-nitride (WN), tungsten-silicon-nitride (WiSiN), and/or combinations of such materials (e.g., a multi-lay stack of Ta/TaN).

Thus, as illustrated in various figures, whenever a first one of the interconnect features 112, 113, 115 conjoins or meets with a second one of the interconnect features 112, 113, 115, the layers 117, 119 are absent between the junction of the conductive materials of the two conjoined interconnect features. This results in the conductive materials of the interconnect features 112, 113, 115 to be monolithic and continuous, without any seam or barrier layer therebetween. This reduces resistance between the interconnect features 112, 113, 115, thereby improving performance of the integrated circuit.

As seen in FIG. 1C (and also FIG. 1E), the interconnect features 112, 113 form a continuous and monolithic body of conductive material extending vertically between the devices 101a, 101b, where the devices 101a, 101b have sub-fin regions 110a, 110b, respectively. The continuous and monolithic body of conductive material has an upper portion between the devices 101a, 101b, and a lower portion between the sub-fin regions 101a, 101b. Here the upper portion comprises at least a section of the interconnect feature 113, and the lower portion comprises at least a section of the interconnect feature 112. As also discussed, in an example, the width w1 of the lower portion (i.e., the interconnect feature 112) is greater than the width w2 of the upper portion (i.e., the interconnect feature 113) by, for example, is at least 110%, at least 120%, at least 140%, at least 150%, at least 180%, or at least 200%.

As discussed, the interconnect feature 112 comprises a buried or backside power rail (BPR) of the IC 100. For example, the interconnect feature 112 is buried at the sub-fin level of the devices 101a, 101b. For example, instead of being on a front side of the devices 101a, 101b, the power rail is buried at least in part on the backside of the devices 101a, 101b, e.g., within and/or underneath a device layer of the IC 100. Having the power rail buried in the sub-fin region or otherwise on the backside of the devices 101a, 101b resolves mid end of line (MEOL) and/or back end of line (BEOL) metal congestion in the IC 100.

Although not illustrated in FIG. 1A and as illustrated in FIG. 1B, the IC 100 comprises an interlayer dielectric (ILD) layer 125 at least in part encapsulating the devices 101a, 101b and the interconnect features 113, 114, 116, and at least a section of the interconnect feature 115. Note that in the illustrated example, the substrate 102 encapsulates the interconnect feature 112. In an example, the interconnect feature 115 traverses through the ILD 125, and also extends through MEOL and/or BEOL of the IC device 100 (the MEOL and/or BEOL are not illustrated). Thus, the interconnect feature 115 and/or other interconnect features coupled to the interconnect feature 115 traverse through one or more interconnect layers and metallization levels of the MEOL and/or BEOL.

In one embodiment, each of the interconnect features 112, 113, 114, 115, and 116 are formed on corresponding recesses (formation of at least some of which are discussed herein later in turn). For example, a first recess of the interconnect feature 112 is conjoined with a second recess of the interconnect feature 113 at one end, and a third recess of the interconnect feature 115 at another end. The second recess comprising the interconnect feature 113 is coupled to a terminal (e.g., a source 106b) of one of the devices 101a, 101b, via the interconnect feature 114. The third recess comprising the interconnect feature 115 is coupled to the power supply 190. The first, second, and third recesses comprise the monolithic continuous body of conductive material of the interconnect features 112, 113, 115. The continuous and conformal layer 117 is on walls of the first, second, and third recesses, where the layer 117 is a barrier/liner/encapsulation layer.

FIG. 2 illustrates a flowchart depicting a method 200 of forming an integrated circuit (such as the IC 100 of FIGS. 1A-1F) comprising a BPR structure including a first interconnect feature (e.g., interconnect feature 112), wherein a second interconnect feature (e.g., second interconnect feature 115) supplies power to the first interconnect feature, and a third interconnect feature (e.g., second interconnect feature 113) provides power from the first interconnect feature to a terminal of a device (such as a transistor 101b), wherein the first, second, and third interconnect features collectively form a continuous and monolithic body of conductive material, and wherein a continuous conformal barrier layer (e.g., barrier layer 117) is on the walls of the first, second, and third interconnect features, in accordance with an embodiment of the present disclosure. FIGS. 3A1, 3A2, 3A3, 3B1, 3B2, 3B3, 3C1, 3C2, 3C3, 3C4, 3D1, 3D2, 3D3, 3E, 3E2, 3E3, 3F1, 3F2, 3F3, 3G1, 3G2, 3G3, 3H1, 3H2, and 3H3 illustrate cross-sectional and perspective views of at least a section of an IC comprising the first, second, and third interconnect features of FIGS. 1A-2 in various stages of processing, in accordance with an embodiment of the present disclosure. FIGS. 2 and 3A1-3H3 will be discussed in unison.

Figure 4:
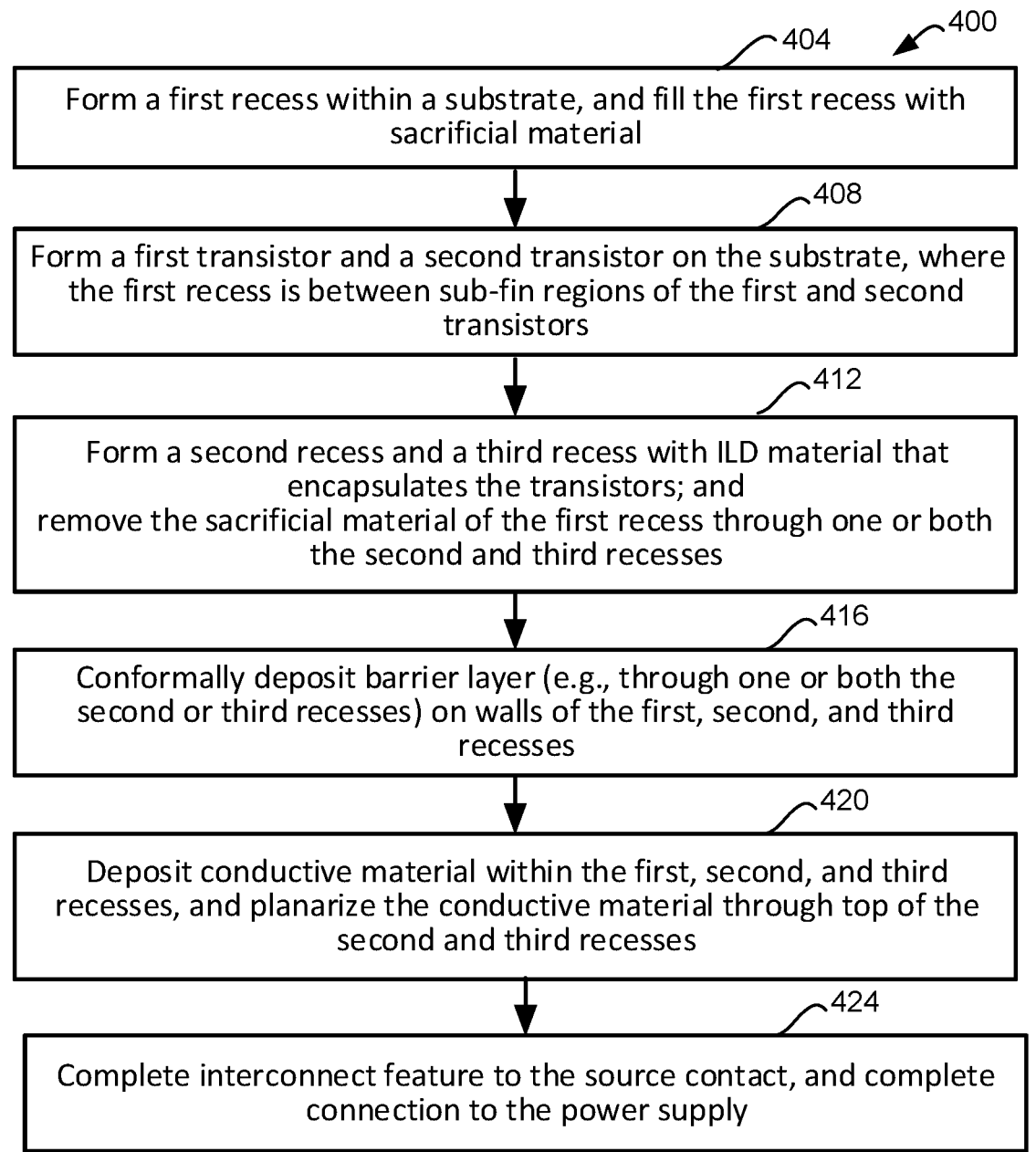

Note that FIGS. 3A1, 3B1, 3C1, and so on illustrate the cross-sectional view along line B-B' of FIG. 1A (i.e., a view similar to the view of FIG. 1C). Note that FIGS. 3A2, 3B2, 3C2, and so on illustrate the cross-sectional view along line A-A' of FIG. 1A (i.e., a view similar to the view of FIG. 1D). Also, note that FIGS. 3A3, 3B3, 3C3, and so on illustrate the side view along line C-C' of FIG. 1A (i.e., a view similar to the view of FIG. 1E). Finally, FIG. 3C4 illustrates a perspective view, and illustrates only some components of the IC 100, e.g., similar to the view of FIG. 1B.

Referring to FIG. 2, the method 200 comprises forming a first recess within a substrate and filling the first recess with sacrificial material. For example, FIGS. 3A1-3A3 illustrate a first recess 312 formed within the substrate 102, where the first recess 312 is filled with sacrificial material 305.

Referring again to FIG. 2, the method 200 proceeds from 204 to 208, where a first transistor and a second transistor are formed on the substrate, and where the first recess is between sub-fin regions of the first and second transistors. For example, FIGS. 3B1 and 3B2 illustrate transistors 101a, 101b formed on the substrate 102, where the recess 312 is laterally between sub-fin regions 110a, 110b of transistors 101a, 101b, respectively. Structure of the transistors 101a, 101b have been discussed herein previously. Formation of the two transistors 101a, 101b can be performed using any suitable techniques for forming transistors.

Referring again to FIG. 2, the method 200 proceeds then from 208 to 212, where a common recess is formed within an ILD that encapsulates the two transistors, where the common recess comprises conjoined second recess, third recess, and an intermediate recess between the second and third recesses. The common recess exposes the sacrificial material of the first recess. Subsequently, sacrificial material of the first recess is removed through the common recess.

FIGS. 3C1, 3C2, 3C3, and 3C4 illustrate the common recess 314 within ILD 125, where the common recess 314 exposes the sacrificial material 305 of the first recess 312. FIG. 3C3 illustrates boundaries of the second recess 314a, third recess 314b, and the intermediate recess 314c between the second and third recesses. Note that there are no physical boundaries between the second, third, and intermediate recesses—rather, there is a single common recess 314. Hence, the boundaries between these recesses are drawn with doted lines in FIG. 3C3. An appropriate etching technique may be used to form the common recess, such as an anisotropic etch process, in which a mask is used to selectively remove the fLD 125 and form the common recess.

Note that the view of FIG. 3C1 illustrates the second recess 314a that extends between the source regions 106a, 106b. The view of FIG. 3C2 illustrates the intermediate recess 314c that at least in part extends between the gate electrodes 132a and 132b of the two devices. The third recess 314b is not visible in either of the views of FIG. 3C1 or 3C2, but is visible in the view of FIG. 3C3.

Subsequently and also at 212 of the method 200, sacrificial material 305 of the first recess 312 is removed through the common recess 314, and hence, the first recess 312 is shown to not include the sacrificial material 305 in FIGS. 3C1-3C4. An appropriate etching technique may be used to remove the sacrificial material 305, such as an isotropic etch process (e.g., nitric acid/hydrofluoric acid) or another suitable etch process.

Referring again to FIG. 2, the method 200 proceeds from 212 to 216, where a barrier layer is conformally deposited on walls of the first recess and the common recess. For example, FIGS. 3D1, 3D2, and 3D3 illustrate the barrier layer 117 conformally deposited on the walls of the first recess 312 and the common recess 314. For example, atomic layer epitaxy, CVD, PVD, ALD, VPE, MBE, LPE, or other suitable conformal deposition technique is used to deposit the barrier layer 117 on the walls of the recesses.

Referring again to FIG. 2, the method 200 then proceeds from 216 to 220, where conductive material is deposited within the first and common recesses, and the conductive material is planarized through top of the common recess. For example, FIGS. 3E1, 3E2, and 3E3 illustrate conductive material deposited within the first recess 312 and the common recesses 314, and planarized through a top of the common recesses 314.

In an example, deposition of the conductive material includes forming a seed layer (not illustrated in the figures) of conductive material on the barrier layer 117. The seed layer may be formed by a deposition process such as atomic layer epitaxy, CVD, PVD, ALD, VPE, MBE, LPE, via electroplating, e.g., in order to improve subsequent deposition of conductive material. In an example, one or more monolayers of seed material may be used. In an example, the seed layer may be deposited using an electroless deposition. In an example, the seed material is to be subsequently used for an electroplating deposition. In an example, the seed layer comprises copper (Cu) or an alloy of copper (e.g., copper-tin (CuSn), copper-indium (CuIn), copper-magnesium (CuMg), copper-aluminum (CuAl)), cobalt, and/or the like, e.g., to assist with a subsequent formation of a copper containing conductive material thereon. In an example, the process of seed layer formation may be performed if the final conductive material to be deposited in the recesses include copper or another appropriate metal or metal alloy that is to be electroplated. For example, if the final conductive material include copper, then the copper is to be deposited using an electroplating process on the seed layer. The seed layer is used to facilitate the electroplating process.

However, if the final conductive material in the recesses can be deposited using another deposition technique different from electroplating (such as CVD or PVD or ALD), then the process of forming the seed layer can be skipped in an example. In an example, ruthenium may be used as the conductive material and may be deposited using ALD, and hence, deposition of ruthenium may not necessitate the formation of the seed layer.

Subsequent to formation of the seed layer, the conductive material comprising metal (such as copper) may be deposited via electroplating. In another example, electroless deposition, CVD, PVD, ALD or another suitable deposition technique may be used, e.g., when the conductive material comprises ruthenium or another appropriate conductive material.

After deposition of the conductive material, the conductive material is planarized from the top surface of the common recess 314, e.g., using CMP (chemical mechanical polishing), mechanical polishing, or another suitable planarization technique.

As discussed, the first recess 312 and the common recess 314 are filled with the conductive material during the same deposition process. Thus, the conductive material is continuous and monolithic within both the recesses 312, 314. Thus, for example, there is no seam or break or the barrier layer within the body of conductive material.

Referring again to FIG. 2, the method 200 proceeds from 220 to 224, where the conductive material from the intermediate section 314c of the common recess 314 is removed, e.g., without removing the conductive material within the first recess 312, the second recess 314a, and the third recess 314b, as illustrated in FIGS. 3F1, 3F2, and 3F3. Note that in an example, sections of the layer 117 on walls of the intermediate section 314c of the common recess 314 are also removed, as illustrated in FIG. 3F2. An appropriate etching technique may be used to remove the conductive material and/or the barrier layer 117 from the intermediate recess 314c, such as an anisotropic etch process, in which a mask is used to cover the recesses 314a and 314b and expose the recess 314c.

Referring again to FIG. 2, the method 200 proceeds from 224 to 228, where barrier layer 117 is deposited on at least some of the walls of the second and third recesses, and then the intermediate recess is filed with the ILD. For example, the removal of the conductive material during process 224 exposes some of the walls of the second recess 314a and third recess 314b, which were facing the intermediate recess 314c, and the barrier layer 117 is deposited on these exposed walls. FIGS. 3G1, 3G2, 3G3 illustrate the barrier layer 117 is deposited on these exposed walls. Subsequently, the intermediate recess 312c is filled with the ILD 125, as seen in FIGS. 3G2 and 3G3. This completes the formation of the interconnect feature 112 within the recess 312, formation of the interconnect feature 113 within the recess 314a, and formation of the interconnect feature 115 within the recess 314b.

Referring again to FIG. 2, the method 200 then proceeds from 228 to 232, where the interconnect feature 114 between the interconnect feature 113 and the source contact 116 is completed, and a connection between the interconnect feature 115 and the power supply 190 is complete. For example, FIGS. 3H1, 3H2, and 3H3 illustrate the interconnect feature 114 between the interconnect feature 113 and the source contact 116. Connection to the power supply 190 is not illustrated in these figures, although such a connection has been discussed with respect to FIGS. 1A and 1B.

Note that the method 200 of FIG. 2 includes formation of a common recess 314, and later conductive material from sections of the common recess 314 is removed and filed with ILD 125, to thereby separate the second and third recesses 314a, 314b. In contrast, below discussed method 400 of FIG. 4 includes separately forming a second recess and a third recess for the interconnect features 113 and 115, respectively. Thus, contrary to the method 200 of FIG. 2, in the method 400 of FIG. 4, no common recess is formed— instead, the second recess and the third recess are separate from the beginning.

FIG. 4 illustrates another flowchart depicting a method 400 of forming an integrated circuit (such as the IC 100 of FIGS. 1A-1F) comprising a BPR structure including a first interconnect feature (e.g., interconnect feature 112), wherein a second interconnect feature (e.g., second interconnect feature 115) supplies power to the first interconnect feature, and a third interconnect feature (e.g., second interconnect feature 113) provides power from the first interconnect feature to a terminal of a device (such as a transistor 101b), wherein at least the first, second, and third interconnect features collectively form a continuous and monolithic body of conductive material, and wherein a continuous conformal barrier layer (e.g., barrier layer 117) is on the walls of the first, second, and third interconnect features, in accordance with an embodiment of the present disclosure. FIGS. 5A1, 5A2, 5A3, 5B1, 5B2, 5B3, 5C1, 5C2, 5C3, 5D1, 53D2, and 5D3 illustrate cross-sectional views of at least a section of an IC comprising the first, second, and third interconnect features of FIGS. 1A-1E and 4 in various stages of processing, in accordance with an embodiment of the present disclosure. FIGS. 4 and 5A1-5D3 will be discussed in unison.

Figures 5A1, 5A2, 5A3:
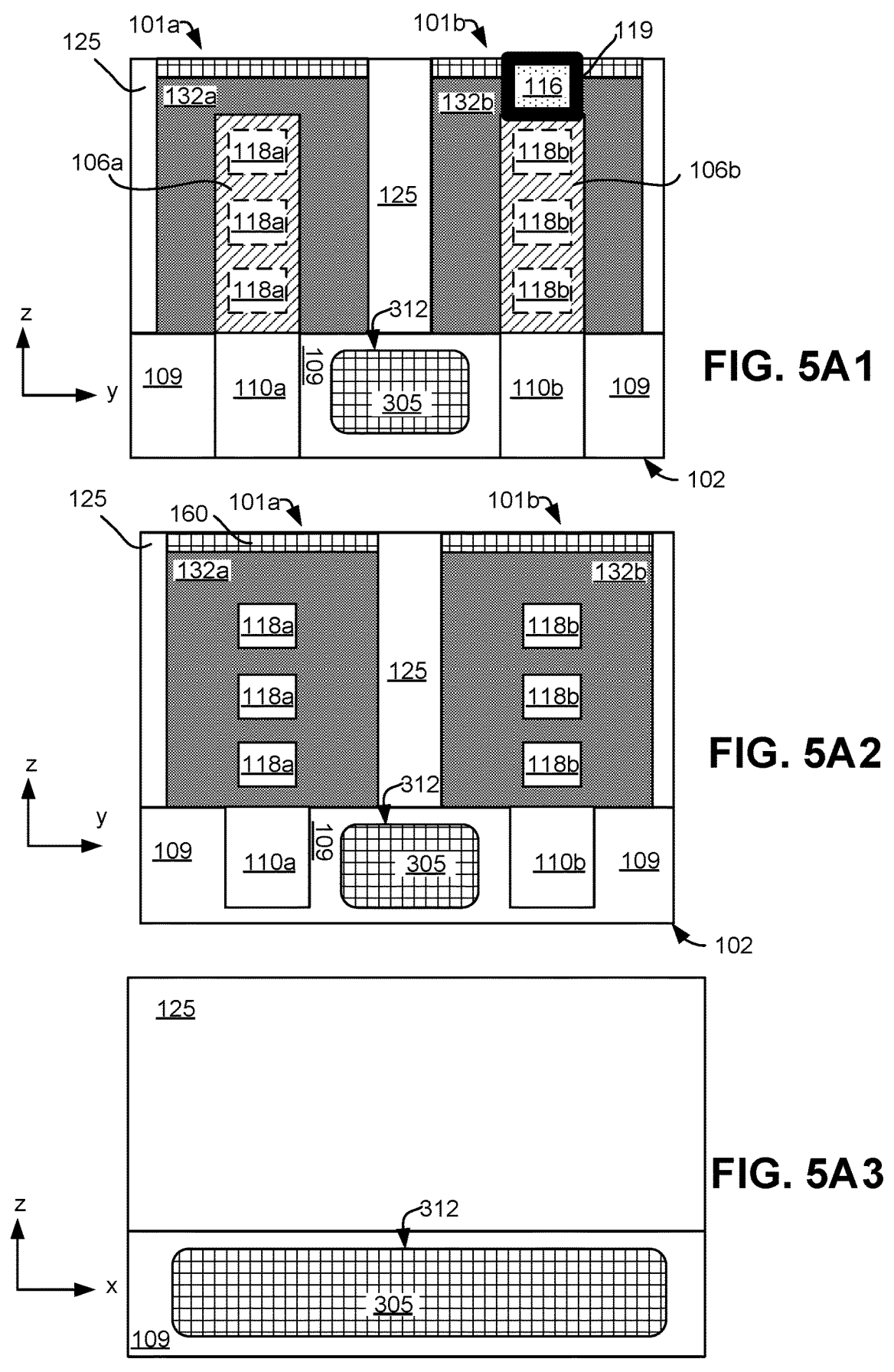
Figures 5C1, 5C2, 5C3:
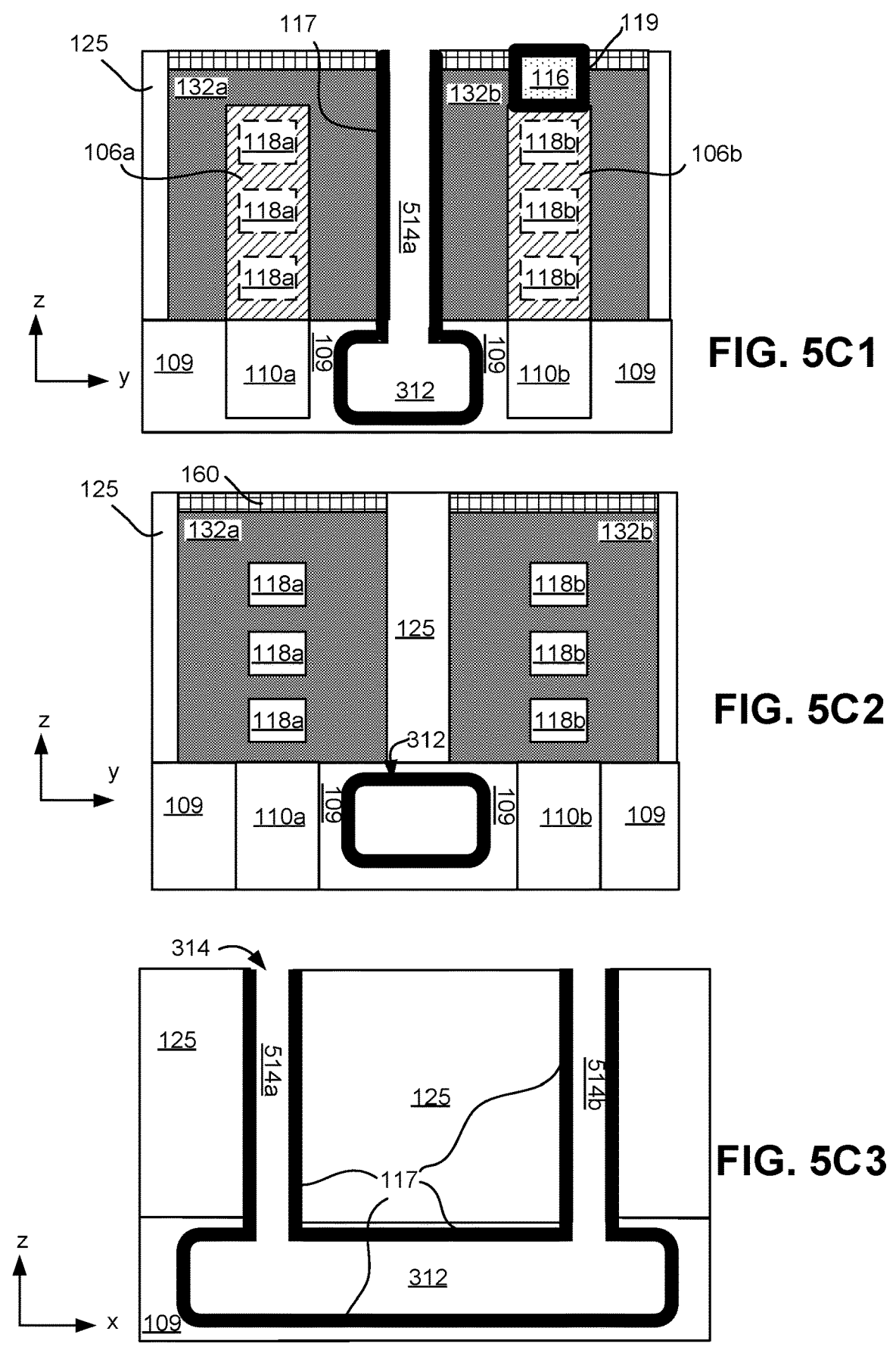

Operations 404 and 408 of the method 400 of FIG. 4 are similar to operations 204 and 208 of the method 200 of FIG. 2, respectively, and hence, operations 404 and 408 are not discussed in further detail herein. At the end of the operation 408, the structures illustrated in FIGS. 5A1-5A3 are formed, where FIGS. 5A 1-5A3 are similar to FIGS. 3B1-3B3 discussed herein earlier.

The method 400 then proceeds from 408 to 412, where a second recess 514a and a third recess 514b are formed within ILD 125, and the sacrificial material 305 of the first recess is removed through one or both the second and third recesses. FIGS. 5B1, 5B2, 5B3 illustrate the second recess

514a and the third recess 514b that lands on the first recess 312. Thus, the sacrificial material within the first recess 312 is exposed through the second recess 514a and the third recess 514b.

An appropriate etching technique may be used to form the two recesses, such as an anisotropic etch process, in which a mask is used to selectively remove the ILD 125 and form the two recess. The sacrificial material 305 of the first recess 312 is then removed through one or both the second and third recesses using a suitable etching technique, such as an isotropic etch process (e.g., nitric acid/hydrofluoric acid) or another suitable etch process.

The method 400 then proceeds from 412 to 416, where a barrier layer is deposited on walls of the first recess 312, second recess 514a, and third recess 514b. In an example, the barrier layer 117 is conformally deposited through any one or both the second and/or third recesses. FIGS. 5C1, 5C2, 5C3 illustrate the barrier layer 117 on walls of the recesses 312, 514a, 514b. For example, atomic layer epitaxy, CVD, PVD, ALD, VPE, MBE, LPE, or other suitable conformal deposition technique is used to deposit the barrier layer 117 on the walls of the recesses.

The method 400 then proceeds from 416 to 420, where conductive material is deposited within the first, second, and third recesses, and the conductive material is planarized through top of the second and third recesses. A capping or encapsulation layer may be formed on top surface of the second and third recesses, as illustrated in FIGS. 5D1 and 5D3. Processes associated with deposition of conductive material have been discussed in detail with respect to process 200 of method 200. FIGS. 5D1, 5D2, and 5D3 illustrate the recesses, with conductive material therewithin. As all three recesses are filled with the conductive material during the same deposition process, the conductive material is continuous and monolithic within both the recesses 312, 514a, 514b. Thus, for example, there is no seam or break or the barrier layer within the body of conductive material. This completes the formation of the interconnect feature 112 within the first recess 312, formation of the interconnect feature 113 within the second recess 514a, and formation of the interconnect feature 115 within the third recess 514b.

Referring again to FIG. 4, the method 400 proceeds from 420 to 424, where the interconnect feature 114 between the interconnect feature 113 and the source contact 116 is completed, and a connection between the interconnect feature 115 and the power supply 190 is complete. For example, previously discussed FIGS. 3H1, 3H2, and 3H3 illustrate the interconnect feature 114 between the interconnect feature 113 and the source contact 116. Connection to the power supply 190 is not illustrated in these figures, although such a connection has been discussed with respect to FIGS. 1A and 1B.

Note that the processes in method 400 are shown in a particular order for ease of description. However, one or more of the processes may be performed in a different order or may not be performed at all (and thus be optional), in accordance with some embodiments. Numerous variations on method 400 and the techniques described herein will be apparent in light of this disclosure.

Example System

Figure 6:
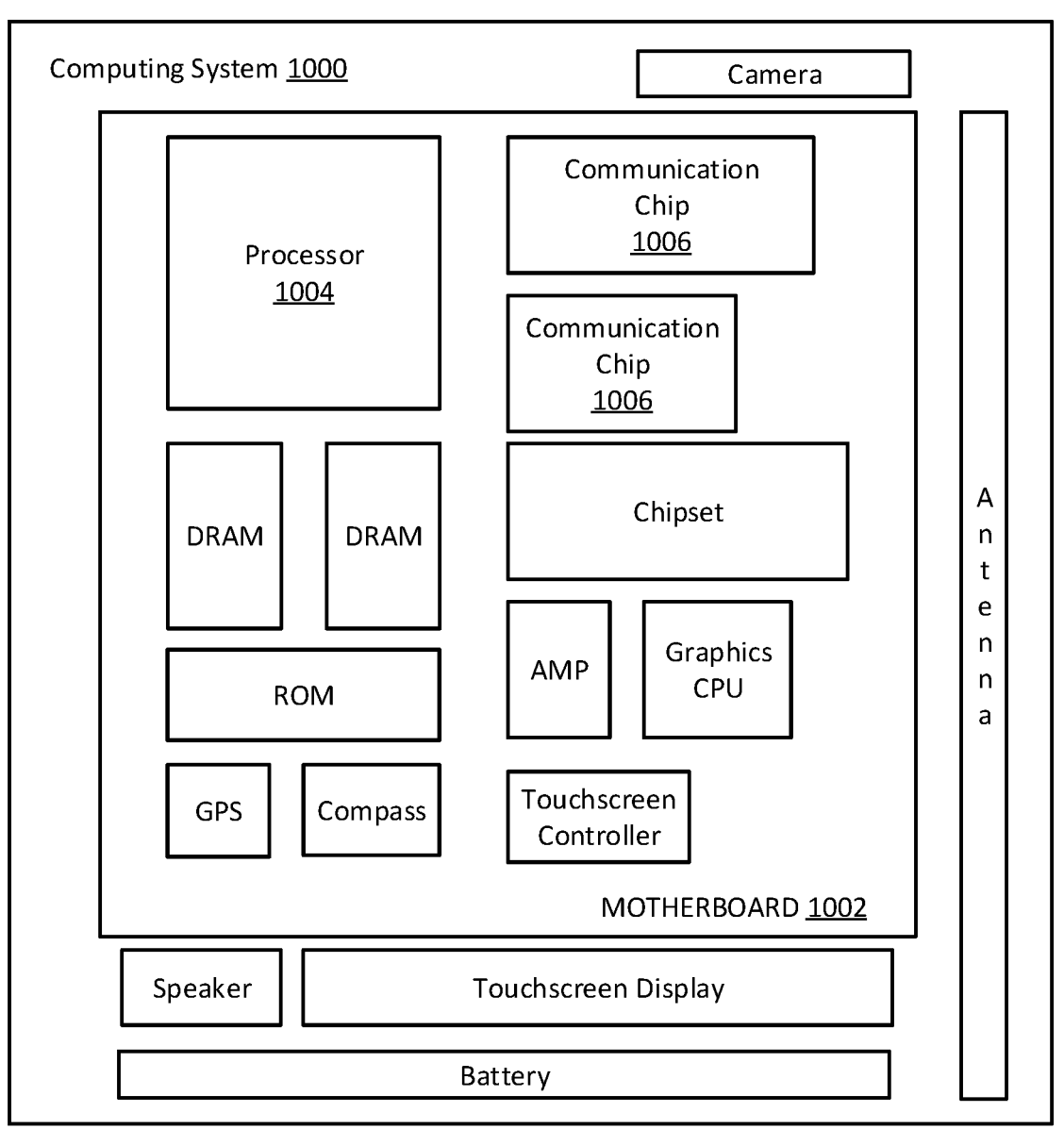
FIG. 6 illustrates a computing system implemented with integrated circuit structures having one or more interconnect features formed using the techniques disclosed herein, in accordance with some embodiments of the present disclosure.

FIG. 6 illustrates a computing system 1000 implemented with integrated circuit structures and/or the interconnect features formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following clauses pertain to further embodiments, from which numerous permutations and configurations will be apparent.

Example 1. An integrated circuit comprising: a first sub-fin; a second sub-fin laterally spaced from the first sub-fin by a distance of 100 nm or less; a first transistor device over the first sub-fin and having a first contact; a second transistor device over the second sub-fin and having a second contact; a continuous and monolithic body of conductive material extending vertically between the first and second transistor devices and the first and second sub-fins, the body of conductive material having (i) an upper portion between the first and second transistor devices and (ii) a lower portion between the first and second sub-fins, the lower portion being at least 1.2 times wider than the upper portion; a continuous conformal layer that extends along a sidewall of the lower portion of the body and a sidewall of the upper portion of the body, but does not separate the upper and lower portions; and a conductive interconnect feature connecting the upper portion of the body to at least one of the first and second contacts.

Example 2. The integrated circuit of Example 1, wherein the upper portion of the body of conductive material is a first upper portion, and wherein the continuous and monolithic body of conductive material further has a second upper portion that extends vertically from the lower portion.

Example 3. The integrated circuit of Example 2, wherein the continuous conformal layer further extends along a sidewall of the second upper portion of the body, but does not separate the second upper portion and the lower portion.

Example 4. The integrated circuit of Example 2 or 3, wherein a first end of the second upper portion of the body is coupled to a power supply, and a second end of the second upper portion of the body is conjoined to the lower portion of the body, and wherein the second upper portion of the body is to supply power from the power supply to the lower portion of the body.

Example 5. The integrated circuit of Example 4, wherein the lower portion is to supply the power from the second upper portion to the at least one of the first and second contacts, through the first upper portion and the conductive interconnect feature.

Example 6. The integrated circuit of any one of Examples 2-5, wherein the second upper portion extends vertically upwards to a metallization level that is above a level of the first and second transistor devices.

Example 7. The integrated circuit of any one of Examples 2-6, wherein a first vertical height of the first upper portion is less than a second vertical height of the second upper portion, and wherein the first and second vertical heights are measured in a direction that is perpendicular to a length of the lower portion.

Example 8. The integrated circuit of any one of Examples 1-7, wherein each of the first sub-fin, the lower portion of the body of conductive material, and the second sub-fin are at least partially in a layer of dielectric material, and the continuous conformal layer is between the dielectric material and at least the lower portion of the continuous body.

Example 9. The integrated circuit of any one of Examples 1-8, wherein the body of conductive material comprises a buried or backside power rail.

Example 10. The integrated circuit of any one of Examples 1-9, wherein the first or second transistor includes a gate structure, and the first or second contact is on the gate structure.

Example 11. The integrated circuit of any one of Examples 1-10, wherein the first or second transistor includes a source region or drain region, and the first or second contact is on the source region or drain region.

Example 12. The integrated circuit structure of any one of Examples 1-11, wherein the continuous conformal layer comprises one or more of cobalt, nickel, ruthenium, molybdenum, manganese, titanium, tungsten, tantalum, nitrogen, silicon.

Example 13. The integrated circuit structure of any one of Examples 1-12, wherein the continuous conformal layer comprises metal.

Example 14. The integrated circuit of any one of Examples 1-13, wherein the continuous conformal layer is a barrier layer.

Example 15. The integrated circuit structure of any one of Examples 1-14, wherein the body of conductive material comprises copper.

Example 16. The integrated circuit structure of any one of Examples 1-14, wherein the body of conductive material comprises one or more of copper or ruthenium.

Example 17. The integrated circuit structure of any one of Examples 1-14, wherein the body of conductive material comprises one or more of copper, ruthenium, molybdenum, tin, indium, antimony, or bismuth.

Example 18. The integrated circuit structure of any one of Examples 1-17, wherein the lower portion is at least 1.5 times wider than the upper portion.

Example 19. The integrated circuit of any one of Examples 1-18, wherein the first and second transistors are nanoribbon or nanosheet transistors, and include wrap around gate structures.

Example 20. An integrated circuit structure comprising: a substrate, and one or more dielectric layers above the substrate; one or more transistors on the substrate; a first recess at least in part within the substrate, and a second recess and a third recess at least in part within the one or more dielectric layers; a continuous monolithic body of conductive material within the first recess, the second recess, and the third recess; and a conductive interconnect feature to couple the second recess with a terminal of a transistor of the one or more transistors.

Example 21. The integrated circuit structure of Example 20, further comprising: a continuous and conformal layer on walls of the first recess, the second recess, and the third recess.

Example 22. The integrated circuit structure of Example 20 or 21, wherein: the second recess is conjoined with the first recess at one end and is coupled to the terminal of the transistor at another end; and the third recess is conjoined with the first recess at one end and is coupled to a power supply terminal at another end.

Example 23. The integrated circuit structure of any one of Examples 20-22, wherein the transistor of the one or more transistors is a first transistor, and wherein the integrated circuit structure further comprises: a first region within the substrate, the first region underneath a channel region of the first transistor; and a second region within the substrate, the second region underneath a channel region of a second transistor of the one or more transistors, wherein the first recess is laterally between the first region and the second region.

Example 24. The integrated circuit structure of Example 23, wherein the first region and the second region are a first sub-fin region of the first transistor and a second sub-fin region of the second transistor, respectively.

Example 25. The integrated circuit structure of any one of Examples 20-24, wherein the transistor of the one or more transistors is a first transistor, and wherein the second recess is laterally between the first transistor and a second transistor of the one or more transistors.

Example 26. The integrated circuit structure of Example 25, wherein at least a section of the third recess extends above the first transistor and the second transistor.

Example 27. The integrated circuit structure of any one of Examples 20-26, wherein the transistor of the one or more transistors is a first transistor, and wherein at least a section of the third recess is laterally between the first transistor and a second transistor of the one or more transistors.

Example 28. The integrated circuit structure of any one of Examples 20-27, wherein the terminal of the transistor is one of a source terminal or a drain terminal.

Example 29. The integrated circuit structure of any one of Examples 20-28, further comprising: a continuous and conformal layer on walls of the first recess, the second recess, and the third recess, wherein the continuous and conformal layer comprises one or more of cobalt, nickel, ruthenium, molybdenum, manganese, titanium, tungsten, tantalum, nitrogen, silicon.

Example 30. The integrated circuit structure of any one of Examples 20-29, further comprising: a continuous and conformal layer on walls of the first recess, the second recess, and the third recess, wherein the continuous and conformal layer comprises metal.

Example 31. The integrated circuit structure of any one of Examples 20-30, wherein the continuous monolithic body of conductive material comprises one or more of copper, ruthenium, molybdenum, tin, indium, antimony, or bismuth.

Example 32. A method of forming interconnect features in an integrated circuit, comprising: forming a first recess within a substrate; depositing sacrificial material within the first recess; forming (i) a first device having a first sub-fin region and (ii) a second device having a second sub-fin region, wherein the first recess is laterally between the first sub-fin region and the second sub-fin region, and wherein dielectric material at least in part encapsulates the first and second devices; forming a second recess and a third recess within the dielectric material, the second and third recesses landing on the first recess comprising the sacrificial material; removing the sacrificial material of the first recess through any one or both the second and third recesses; conformally depositing, through any one or both the second and third recesses, a barrier layer on walls of the first, second, and third recesses; and depositing, through any one or both the second and third recesses, a monolithic and continuous body of conductive material within the first, second, and third recesses having the barrier layer on the walls, so as to form (i) a power rail within the first recess having the barrier layer and a first section of the body of conductive material, (ii) a first interconnect feature within the second recess having the barrier layer and a second section of the body of conductive material, and (iii) a second interconnect feature within the third recess having the barrier layer and a third section of the body of conductive material.

Example 33. The method of Example 32, further comprising: forming a third interconnect feature that couples the first interconnect feature to a terminal of one of the first or second devices; and forming a fourth interconnect feature that couples the second interconnect feature to a power supply terminal.

Example 34. A method of forming interconnect features in an integrated circuit, comprising: forming a first recess within a substrate; depositing sacrificial material within the first recess; forming a first device having a first sub-fin region and a second device having a second sub-fin region, wherein the first recess is laterally between the first sub-fin region and the second sub-fin region, and wherein dielectric material at least in part encapsulates the first and second devices; forming a common recess within the dielectric material, the common recess landing on the first recess comprising the sacrificial material, the common recess having a first section, a second section, and an intermediate section laterally between the first and second sections; removing the sacrificial material of the first recess through the common recess; conformally depositing a barrier layer on walls of the first and common recesses; depositing a monolithic and continuous body of conductive material within the first and common recesses having the barrier layer on the walls; removing a portion of the body of conductive material from the intermediate section of the common recess, without removing conductive material from the first or second sections of the common recess, so as to form (i) a power rail within the first recess having a first section of the body of conductive material, (ii) a first interconnect feature within the first section of the common recess having a second section of the body of conductive material, and (iii) a second interconnect feature within the second section of the common recess having a third section of the body of conductive material.

Example 35. The method of Example 34, further comprising: subsequent to removing the portion of the body of conductive material from the intermediate section of the common recess, conformally depositing the barrier layer on walls of the second section and third section of the body that are exposed due to the removal of the portion of the body.

Example 36. The method of Example 34 or 35, further comprising: forming a third interconnect feature that couples the first interconnect feature to a terminal of one of the first or second devices; and forming a fourth interconnect feature that couples the second interconnect feature to a power supply terminal.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
a first sub-fin;
a second sub-fin laterally spaced from the first sub-fin by a distance of 100 nm or less along a first direction;
a first transistor device over the first sub-fin and having a first contact;
a second transistor device over the second sub-fin and having a second contact;
a continuous and monolithic body of conductive material extending vertically between the first and second transistor devices and the first and second sub-fins, the continuous and monolithic body of conductive material having (i) a first upper portion between the first and second transistor devices, (ii) a second upper portion spaced from the first upper portion along a second direction different from the first direction, and (iii) a lower portion at least between the first and second sub-fins and coupled to the first upper portion and the second upper portion, the lower portion being at least 1.2 times wider than the first and second upper portions along the first direction;
a continuous conformal layer that extends along a sidewall of the lower portion of the body, a sidewall of the first upper portion of the body, and a sidewall of the second upper portion of the body; and
a conductive interconnect feature connecting the first upper portion of the body to at least one of the first and second contacts.

2. The integrated circuit of claim 1, wherein the continuous conformal layer does not separate the second upper portion and the lower portion.

3. The integrated circuit of claim 1, wherein a first end of the second upper portion of the body is coupled to a power supply, and a second end of the second upper portion of the body is conjoined to the lower portion of the body, and wherein the second upper portion of the body is configured to supply power from the power supply to the lower portion of the body.

4. The integrated circuit of claim 3, wherein the lower portion is configured to supply the power from the second upper portion to the at least one of the first and second contacts, through the first upper portion and the conductive interconnect feature.

5. The integrated circuit of claim 1, wherein each of the first sub-fin, the lower portion of the body of conductive material, and the second sub-fin are at least partially in a layer of dielectric material, and the continuous conformal layer is between the dielectric material and at least the lower portion of the continuous body.

6. The integrated circuit of claim 1, wherein the body of conductive material comprises a buried or backside power rail, and the continuous conformal layer is a barrier layer.

7. The integrated circuit of claim 1, wherein the first or second transistor includes a source region or drain region, and the first or second contact is on the source region or drain region.

8. The integrated circuit structure of claim 1, wherein the continuous conformal layer comprises one or more of cobalt, nickel, ruthenium, molybdenum, manganese, titanium, tungsten, tantalum, nitrogen, silicon.

9. The integrated circuit structure of claim 1, wherein the body of conductive material comprises one or more of copper, ruthenium, molybdenum, tin, indium, antimony, or bismuth.

10. An integrated circuit structure comprising:
a substrate, and one or more dielectric layers above the substrate;
one or more transistors on the substrate and spaced from one another along a first direction;
a first recess at least in part within the substrate, and a second recess and a third recess at least in part within the one or more dielectric layers, the second and third recesses spaced from one another along a second direction different from the first direction;
a continuous monolithic body of conductive material within the first recess, the second recess, and the third recess; and
a conductive interconnect feature to couple the second recess with a terminal of a transistor of the one or more transistors.

11. The integrated circuit structure of claim 10, further comprising:
a continuous and conformal layer on walls of the first recess, the second recess, and the third recess.

12. The integrated circuit structure of claim 10, wherein:
the second recess is conjoined with the first recess at one end and is coupled to the terminal of the transistor at another end; and
the third recess is conjoined with the first recess at one end and is coupled to a power supply terminal at another end.

13. The integrated circuit structure of claim 10, wherein the transistor of the one or more transistors is a first transistor, and wherein the integrated circuit structure further comprises:
a first region within the substrate, the first region underneath a channel region of the first transistor; and
a second region within the substrate, the second region underneath a channel region of a second transistor of the one or more transistors,
wherein the first recess is laterally between the first region and the second region.

14. The integrated circuit structure of claim 13, wherein the first region and the second region are a first sub-fin region of the first transistor and a second sub-fin region of the second transistor, respectively.

15. The integrated circuit structure of claim 10, wherein the terminal of the transistor is one of a source terminal or a drain terminal.

16. The integrated circuit structure of claim 10, further comprising:
a continuous and conformal layer on walls of the first recess, the second recess, and the third recess, wherein the continuous and conformal layer comprises one or more of cobalt, nickel, ruthenium, molybdenum, manganese, titanium, tungsten, tantalum, nitrogen, silicon.

17. The integrated circuit structure of claim 10, wherein the continuous monolithic body of conductive material comprises one or more of copper, ruthenium, molybdenum, tin, indium, antimony, or bismuth.

18. An integrated circuit comprising:
a first semiconductor device having a first sub-fin and one or more first semiconductor bodies over the first sub-fin and extending from a first source or drain region to a second source or drain region in a first direction;
a second semiconductor device having a second sub-fin and one or more second semiconductor bodies over the second sub-fin and extending from a third source or drain region to a fourth source or drain region in the first direction, the third source or drain region laterally spaced from the first source or drain region along a second direction substantially orthogonal to the first direction, and the fourth source or drain region laterally spaced from the second source or drain region along the second direction;
a continuous and monolithic body of conductive material extending vertically between the first and second semiconductor devices along the second direction, the body of conductive material having a first upper portion extending vertically between the first and third source or drain regions, a second upper portion extending vertically between the second and fourth source or drain regions and spaced from the first portion along the first direction, and a lower portion between the first and second sub-fins and coupled to the first upper portion and the second upper portion, the lower portion being wider than the first upper portion and wider than the second upper portion;
a conductive interconnect feature contacting the first upper portion of the body; and
a contact extending between the conductive interconnect feature and a top surface of the first source or drain region or the third source or drain region.

19. The integrated circuit of claim 18, further comprising a continuous conformal layer that extends along a sidewall of the lower portion of the body, a sidewall of the first upper portion of the body, and a sidewall of the second upper portion of the body.

20. The integrated circuit of claim 19, wherein the body of conductive material comprises a buried or backside power rail, and the continuous conformal layer is a barrier layer.

\* \* \* \* \*